US007843272B2

(12) United States Patent
Yamaguchi

(10) Patent No.: US 7,843,272 B2
(45) Date of Patent: Nov. 30, 2010

(54) LOW NOISE AMPLIFIER

(75) Inventor: Kouichiro Yamaguchi, Osaka (JP)

(73) Assignee: Icom Incorporated (JP)

( * ) Notice: Subject to any disclaimer, the term of this patent is extended or adjusted under 35 U.S.C. 154(b) by 0 days.

(21) Appl. No.: 12/533,113

(22) Filed: Jul. 31, 2009

(65) Prior Publication Data

US 2010/0052784 A1 Mar. 4, 2010

(30) Foreign Application Priority Data

Aug. 28, 2008 (JP) ............... 2008-219441

(51) Int. Cl.
*H03F 3/04* (2006.01)
(52) U.S. Cl. .............. 330/301; 330/79; 330/292
(58) Field of Classification Search ............... 330/301, 330/79, 292
See application file for complete search history.

(56) References Cited

U.S. PATENT DOCUMENTS

| 7,256,646 | B2 * | 8/2007 | Eid et al. | 327/563 |
|---|---|---|---|---|
| 7,414,481 | B2 * | 8/2008 | Li et al. | 330/311 |
| 7,489,192 | B2 * | 2/2009 | Vitzilaios et al. | 330/79 |
| 7,633,344 | B2 * | 12/2009 | Yamaguchi | 330/291 |
| 7,737,783 | B2 * | 6/2010 | Yamaguchi | 330/260 |
| 7,737,788 | B1 * | 6/2010 | Roo et al. | 330/311 |
| 2007/0096831 | A1 | 5/2007 | Gao et al. | |
| 2008/0122538 | A1 | 5/2008 | Park et al. | |

FOREIGN PATENT DOCUMENTS

JP 2003-289226 10/2003

OTHER PUBLICATIONS

Extended Search Report by European Patent Office of EP09166912. 7, Jan. 2010.
Chiang, Pei-Yaun; Jou, Christina F.; Wu, Hui-I; Zhe-Yang, Huang; "A 10~18GHz Wide-band Transformer feedback LNA", RFIT2007-IEEE International Workshop on Radio-Frequency Integration Technology Dec. 9-11, 2007.
Cassan, David J. "A 1-V Transformer-Feedback Low-Noise Amplifier for 5-GHz Wireless LAN in 0.18-um CMOS" IEEE Journal of Solid-State Circuits, vol. 38, No. 3, Mar. 2003.
Long, John R. "Monolithic Transformers for Silicon RF IC Design" IEEE Journal of Solid-State Circuits, vol. 35, No. 9, Sep. 2000.
Xu, J.; Woestenburg B.; Geralt Bij De Vatte J.; Serdijn, W.A.; "GaAs 0.5dB NF Dual-loop Negative-Feedback Broadband Low-Noise Amplifier IC"; Electronics Letters Jul. 07, 2005, vol. 41, No. 14.

(Continued)

*Primary Examiner*—Patricia Nguyen
(74) *Attorney, Agent, or Firm*—Baker & McKenzie LLP

(57) ABSTRACT

A low noise amplifier having a wide operating frequency band and a high dynamic range is provided. A transformer having a secondary winding connected between an input terminal to which an input signal is applied and a positive differential output terminal, and a primary winding connected between a negative differential output terminal and an input node is provided as a feedback circuit between a cascode amplifier circuit, which includes transistors and a resistor, and an output circuit, which includes a transistor and a constant current source. Selective use of a transformer whose leakage inductance has an adequate value as the feedback transformer can realize a low noise amplifier which has a wide operating frequency band and a high dynamic range.

12 Claims, 22 Drawing Sheets

OTHER PUBLICATIONS

Liao, Hsien-Yuan, Liang, Keko-Chun; Chiou, Hwann-Kaeo; "A Compact and Low Power Consumption K-band Differential Low Noise Amplifier Design Using Transformer Feedback Technique", IEEE 2007.

K. Van Hartingsveldt, M.H.L. Kouwenhoven, CJ.M. Verhoeven, "HF Low Noise Amplifiers with Integrated Transformer Feedback", ISCAS 2002, vol. 2, pp. II-815 to II-818, May 2002.

* cited by examiner

LOW NOISE AMPLIFIER

CROSS REFERENCE TO RELATED APPLICATIONS

This application claims priority to the Japanese Patent Application No. 2008-219441, filed on Aug. 28, 2008, in the Japanese Patent Office, and is incorporated by reference in its entirety as if set forth in full.

BACKGROUND

1. Field of the Invention

The present invention relates to a low noise amplifier, and, particularly, to a low noise amplifier with a wide dynamic range, which is used as a high-frequency amplifier for a radio communication device, an input amplifier for an A/D converter, or the like.

2. Description of the Related Art

As a conventional low noise amplifier, there is a cascode-connected amplifier disclosed in Unexamined Japanese Patent Application KOKAI Publication No. 2003-289226. The cascode-connected amplifier is known as a preferable circuit for adaptation to a wide-band amplifier, which is hardly affected by the parasitic capacitor of an input transistor.

"HF Low Noise Amplifiers with Integrated Transformer Feedback" (ISCAS 2002, vol. 2, pp. II-815-II-818, May 2002 written by K. van Hartingsveldt, M. H. L. Kouwenhoven, C. J. M. Verhoeven, A. N. Burghartz) discloses a low noise amplifier having a double negative feedback network, which includes a transformer and a resistor. The low noise amplifier having the double negative feedback network is an excellent circuit, which can achieve a low noise figure, a stable gain and satisfactory input impedance matching.

The contents of Unexamined Japanese Patent Application KOKAI Publication No. 2003-289226 and the contents of "HF Low Noise Amplifiers with Integrated Transformer Feedback" are incorporated therein by reference.

It is theoretically possible to realize a low noise amplifier that has a wide dynamic range and operates with low power consumption by providing a transformer feedback cascode type low noise amplifier (Transformer Feedback Cascode LNA: TFC-LNA), which includes a combination of the cascode-connected LNA having the double negative feedback network, with a high feedback loop gain. However, the trade-off between providing a high feedback loop gain and increasing the cut-off frequency of the feedback loop gain raises a problem such that if a high feedback loop gain is held up to a high frequency band, applying the conventional compensation approach to the LNA cannot provide sufficient phase compensation, resulting in easy oscillation, so that the LNA does not serve as an amplifier.

A TFC-LNA as shown in FIG. 20, which employs the dominant-pole compensation method, generally used to suppress oscillation, is one example of the conventional LNA. This LNA includes transistors having a gain bandwidth (transient frequency) fT of 8 GHz, and operates on a DC supply voltage VDC of 10 V supplied from a DC voltage source DCS.

A signal source 1 with an output impedance R of 50Ω is connected to an input terminal IN via a DC cut-off capacitor 2. The input terminal IN is connected with the hot side of the primary winding of the transformer 3, which has a turn ratio of, for example, 1:2.

The cold side of the primary winding of the transformer 3 is connected to the base of an NPN type transistor 4, which is the input node NI of the cascode amplifier. The base of the transistor 4 is further connected with the positive electrode of a biasing DC voltage source 5 via a choke coil 6.

The collector of the transistor 4 is connected with the emitter of an NPN type transistor 7. The base of the transistor 7 is connected to the positive electrode of a biasing DC voltage source 8, and is AC-grounded. The transistors 4 and 7 are cascode-connected, and the collector of the transistor 7 is connected with one end of a resistor 9, which becomes a load of the cascode amplifier. The other end of resistor 9 is supplied with the DC supply voltage VDC from the DC voltage source DCS.

A node between the resistor 9 and the collector of the transistor 7 is an output node NO from which the output signal of the cascode amplifier is output, and is connected to the base of an NPN type transistor 10, i.e., the input side of an emitter follower. The collector of the transistor 10 is supplied with the DC supply voltage VDC from the DC voltage source DCS. The transistor 10, together with a constant current source 18, constitutes the emitter follower, and operates as the output buffer of the LNA.

A capacitor 11 for phase compensation is connected between the base of the transistor 10, i.e., an output node NO of the cascode amplifier, and the positive electrode of the DC voltage source DCS, i.e., the AC ground. The resistor 9 and the capacitor 11 provide a dominant pole for the feedback loop gain, and work for low-pass filtering of the output signal of the cascode amplifier. The emitter of the transistor 10, i.e., an output terminal OUT of the LNA, is connected with a load 13 of the LNA via a capacitor 12. The load 13 comprises a resistor of, for example, 5 kΩ.

The cold side of the secondary winding of the transformer 3 is connected to the emitter of the transistor 10 or the output terminal OUT of the LNA via a capacitor 14. The hot side of the secondary winding of the transformer 3 is connected to the ground. An output voltage signal applied to the secondary winding of the transformer 3 is transferred to the primary winding side of the transformer 3 by electromagnetic coupling, and is fed back in series to the input voltage signal, thereby forming a first negative feedback network of the LNA.

A resistor 16 and a DC cut-off capacitor 17 are connected between the emitter of the transistor 10 or the output terminal OUT of the LNA and the hot side of the primary winding of the transformer 3 or the input terminal IN of the LNA for shunt feedback of the output signal. This resistor 16 constitutes a second negative feedback network of the LNA. The emitter of the transistor 10 is connected with a constant current source 18 to provide the operating current of the emitter follower.

In this example, the operating current of the emitter follower is set to about 12 mA and a gain of 200 (46 dB) or so is set for the voltage gain of the cascode amplifier, so that the maximum feedback loop gain of the LNA takes a high value equal to or greater than 40 dB.

The voltage gain of the LNA is theoretically given by a turn ratio 1:N of the transformer 3. In this example, the turn ratio of the transformer 3 is 1:2, so that the voltage gain of the LNA is about 6 dB. The transformer 3 is of a commercially available type, which has a loss of about 1.0 dB and a passband of about 3 to 200 MHz. The optimal resistance value of the resistor 16 to be the feedback resistor is theoretically given by an equation (N+1)R where R is the input impedance determined by the specification of the LNA and N is the turn ratio of the transformer 3. In this example, a typical value, 50Ω, is set as the input impedance R, and the resistance value of the resistor 16 is set to 150Ω.

As described above, the resistor 9 and the capacitor 11 work to produce a dominant pole in the transfer function of the feedback loop gain, thereby achieving phase compensation of the LNA. When phase compensation is carried out to provide the feedback loop gain observed at the base of the transistor 4 with a phase margin of about 45 degrees, the required capacitance of the capacitor 11 is equal to or greater than 140 pF. From the viewpoint of the cost restriction, it is not possible to form a capacitor with such a large capacitance on an integrated network. This requires that the capacitor 11 should be an external part, which disadvantageously leads to an increase in the number of parts and an increase in the printed circuit board area. This is one drawback of the dominant-pole compensation method.

FIG. 21 is a diagram showing the feedback loop gain of the LNA shown in FIG. 20, and has the results of simulated measurement of the feedback loop gain observed at the base of the transistor 4, plotted on a Bode diagram.

The feedback loop gain of the LNA, as shown in FIG. 21, takes a maximum value of about 44 dB at a frequency of 360 kHz or so, and drops down to 0 dB at about 190 MHz. The phase margin is 45 degrees, and the gain margin is about 5 dB. The −3 dB cut-off frequency at which the feedback loop gain starts to attenuate is about 1.1 MHz. It is apparent that the LNA keeps its high dynamic range intact only within a frequency band under a few MHz.

According to the dominant-pole compensation method, phase compensation is carried out in such a way that the feedback loop gain decreases at −20 dB/dec. The upper frequency limit of the passband at which the transformer 3 in FIG. 20 shows substantially ideal behavior is approximately 200 MHz, and in a high frequency band equal to or higher than the frequency, deterioration of the phase margin originated from the parasitic capacitor or the like of the transformer 3 becomes prominent in addition to the dominant-pole originated attenuation of the phase margin.

When the maximum feedback loop gain is set to a high value equal to or greater than 40 dB, therefore, the cut-off frequency should be set to 200 MHz/2 dec (=100) or 2 MHz or lower in taking this approach to compensate with a satisfactory phase margin. The band where a high feedback loop gain can be maintained is limited to a frequency significantly lower than the upper limit of the transformer passband, so that the LNA, if used for high frequency applications, cannot demonstrate a substantial performance. This is another drawback of the dominant-pole compensation method.

FIG. 22 shows simulation results which represent a third order intercept point (hereinafter referred to as "IIP3") of the LNA shown in FIG. 20, the abscissa representing the frequency (MHz) while the ordinate represents IIP3 (dBm). In the simulation of the IIP3 characteristic of the LNA, two tone signals with power of −50 dBm at a frequency apart by 10 kHz from the measuring frequency are used as inputs.

As shown in FIG. 22, it is apparent that at 10 MHz, the IIP3 characteristic is deteriorated by 20 dB or greater from the maximum value of 42 dBm. The deterioration of the IIP3 characteristic has occurred in accordance with the attenuation of the feedback loop gain of the LNA. In general, in a negative feedback amplifier, as the feedback loop gain drops, the IIP3 value decreases too. In the LNA using the dominant-pole compensation method, as mentioned above, it is difficult to keep a high feedback loop gain at a high frequency band. Therefore, the LNA in FIG. 20 is not suitable for use as a high-frequency LNA, which demands a wide dynamic range.

The LNA using a Miller compensation method may be used instead of the dominant-pole compensation method shown in FIG. 20. In the dominant-pole compensation method, the capacitor 11 is connected to the output node NO of the cascode amplifier or between the base and collector of the transistor 10 for phase compensation, whereas in the Miller compensation method, a capacitor for phase compensation is connected between the output node NO of the cascode amplifier and the input node NI of the cascode amplifier or the base of the transistor 4.

Given that the capacitance of the phase compensation capacitor is C and the voltage amplification of the cascode amplifier is β, the phase compensation capacitor connected by the Miller compensation method works to present substantially the same effect as that in a case where a shunt capacitor having the capacitance (β-1)C is connected to the input node NI of the cascode amplifier. Therefore, the Miller compensation method can generally carry out phase compensation using a capacitor with a small capacitance as compared with the dominant-pole compensation method.

In the Miller compensation method, however, adding the phase compensation capacitor forms a new signal path from the input node NI to the output node NO, which passes through the phase compensation capacitor. Accordingly, a zero appears in the feedback loop transfer function at a high frequency band, and attenuation of the feedback loop gain becomes moderate in the vicinity of the zero. This shifts the cross-over frequency of the feedback loop gain to the high frequency side, resulting in reduction in phase margin.

In case of carrying out phase compensation by making the capacitance of the phase compensation capacitor larger to reduce the cut-off frequency of the feedback loop gain, the zero of the feedback loop transfer function shifts to the low frequency side at the same time, so that the cross-over frequency falls insufficiently, thus disabling the stabilization of the LNA. While it is possible to prevent the cross-over frequency from becoming higher by reducing the feedback loop gain, the amount of feedback is reduced, thus deteriorating the IIP3 characteristic. The above situations make it difficult to achieve phase compensation of the LNA having a high dynamic range.

SUMMARY OF THE INVENTION

The lower limit of dynamic range of an LNA is determined by its noise figure, while the upper limit depends on its linearity. To sustain the dynamic range high in a wide band, it is indispensable to suppress the noise power contained in the output of the LNA, as well as to maintain the feedback loop gain of the LNA high, up to a high frequency band. Also, it is required that the LNA operate with sufficient stability and retain a satisfactory input impedance matching in a high frequency band.

Accordingly, it is an object of the present invention to provide an LNA which can keep its noise figure lower than conventional LNAs, while maintaining its feedback loop gain high, across a wide frequency band. Further, it is another object of the present invention to show a method to improve the input impedance matching of an LNA having a high dynamic range, in a high frequency band.

To achieve the object, an LNA according to a first aspect of the invention includes a cascode amplifier circuit that has input-stage and output-stage transistors connected in series to each other, and a load element, amplifies a signal at an input node connected with a control electrode of the input-stage transistor, and outputs the amplified signal from an output node of the output-stage transistor, an output circuit that amplifies a signal at the output node, and outputs the amplified signal to a first differential output terminal, a transformer having electro-magnetically coupled primary and secondary windings, the secondary winding having one end connected to an input terminal to which an input signal is applied, and another end connected to a second differential output terminal, the primary winding having one end connected to the input node and another end connected to the first differential output terminal, a feedback network that feeds back a signal at the first differential output terminal to the input terminal, a first phase compensation network connected between the control electrode of the input-stage transistor and the first differential output terminal, and a second phase compensation network connected between a control electrode of the output-stage transistor and the first differential output terminal.

It is preferable that in the LNA, a turn ratio of the primary winding to the secondary winding of the transformer should be 1:1.

An LNA according to a second aspect of the invention includes a cascode amplifier circuit that has input-stage and output-stage transistors connected in series to each other, and a load element, amplifies a signal at an input node connected with a control electrode of the input-stage transistor, and outputs the amplified signal from an output node of the output-stage transistor, an output circuit that amplifies a signal at the output node, and outputs the amplified signal to a first differential output terminal, a first transformer having electro-magnetically coupled primary and secondary windings, the secondary winding having one end connected to an input terminal to which an input signal is applied, the primary winding having one end connected to an input node and another end connected to the first differential output terminal, a second transformer having electro-magnetically coupled primary and secondary windings, the primary winding having one end connected to the input node and another end connected to the other end of the secondary winding of the first transformer, the secondary winding having one end connected to the input terminal and another end connected to a second differential output terminal, a feedback network that feeds back a signal at the first differential output terminal to the input terminal, a first phase compensation network connected between the control electrode of the input-stage transistor and the first differential output terminal, and a second phase compensation network connected between a control electrode of the output-stage transistor and the first differential output terminal.

It is preferable that in the LNA, the first and second transformers should be pair type transformers which also have a turn ratio of 1:1 and a same characteristic, and be integrated by using a multi-aperture core.

Preferably, in the LNA, an output buffer circuit which reduces an output impedance is provided between the other end of the secondary winding of the second transformer and the second differential output terminal.

It is likewise preferable that in the LNA, the first and second transformers should be pair type transformers which have a turn ratio of 1:1 and a same characteristic, and be integrated by using a multi-aperture core.

An LNA according to a third aspect of the invention includes a cascode amplifier circuit that has input-stage and output-stage transistors connected in series to each other, and a load element, amplifies a signal at an input node connected with a control electrode of the input-stage transistor, and outputs the amplified signal from an output node of the output-stage transistor, an output circuit that amplifies a signal at the output node, and outputs the amplified signal to an output terminal, a first transformer having electro-magnetically coupled primary and secondary windings, the secondary winding having one end connected to an input terminal to which an input signal is applied, the primary winding having one end connected to the input node and another end connected to the first differential output terminal, a second transformer having electro-magnetically coupled primary and secondary windings, the primary winding having one end connected to the input node and another end connected to the other end of the secondary winding of the first transformer, the secondary winding having one end connected to the input terminal and another end connected to a second differential output terminal, a feedback network that feeds back a signal at the output terminal to the input terminal, a first phase compensation network connected between the control electrode of the input-stage transistor and the output terminal, and a second phase compensation network connected between a control electrode of the output-stage transistor and the output terminal, wherein a node between the other end of the secondary winding of the first transformer and the other end of the primary winding of the second transformer is connected to the output terminal.

It is also preferable that in the LNA, the first and second transformers should be pair type transformers which have a turn ratio of 1:1 and a same characteristic, and be integrated by using a multi-aperture core.

It is likewise preferable that in the LNA, a turn ratio of the primary winding to the secondary winding of the first transformer should be n:1, a turn ratio of the primary winding to the secondary winding of the second transformer should be 1:n where n is an arbitrary real number larger than 1, and the first transformer and the second transformer should be integrated by using a multi-aperture core.

Preferably, in the LNA, a first output buffer circuit which reduces an output impedance is provided between the other end of the primary winding of the first transformer and the first differential output terminal, and a second output buffer circuit which reduces an output impedance is provided between the other end of the secondary winding of the second transformer and the second differential output terminal.

It is preferable that in the LNA, the first and second transformers should be pair type transformers which have a turn ratio of 1:1 and a same characteristic, and be integrated by using a multi-aperture core.

It is likewise preferable that in the LNA, a turn ratio of the primary winding to the secondary winding of the first transformer should be n:1, a turn ratio of the primary winding to the secondary winding of the second transformer should be 1:n where n is an arbitrary real number larger than 1, and the first transformer and the second transformer should be integrated by using a multi-aperture core.

The LNA according to the invention has the feedback transformer having the secondary winding connected between the input terminal to which the input signal is applied and the second differential output terminal, and the primary winding connected between the first differential output terminal and the input node of the cascode amplifier circuit. Selective use of a transformer whose leakage inductance has an adequate value as the feedback transformer can realize an LNA, which has a wide operating frequency band and a high dynamic range.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

Referring to the accompanying drawings, a first embodiment of the present invention is described below in detail.

Figure 1:
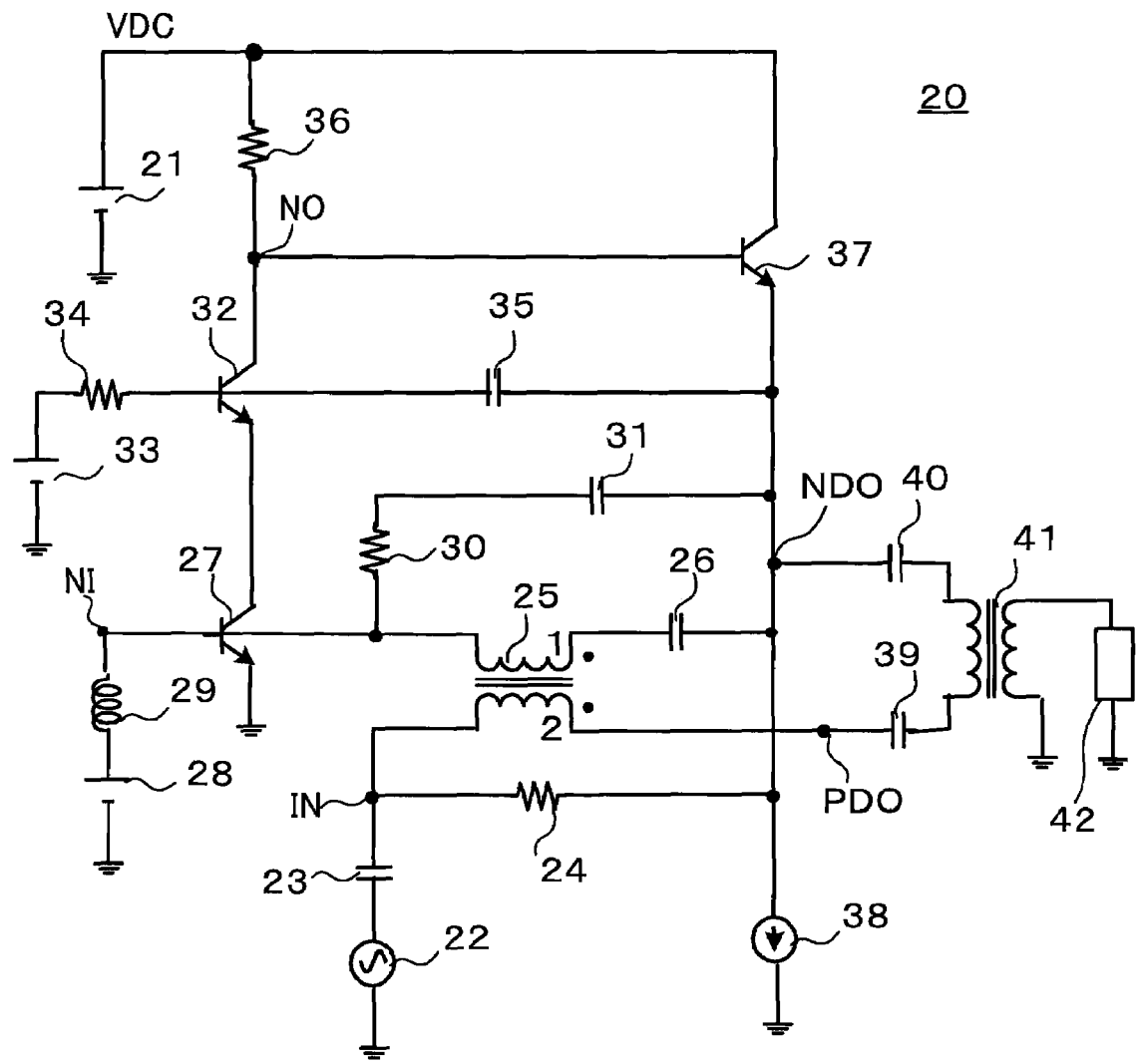
FIG. 1 is a circuit diagram showing an LNA according to a first embodiment of the invention.

As shown in FIG. 1, an LNA 20 according to the first embodiment of the invention is a cascode type amplifier, which has a double negative feedback circuit including a transformer and a resistor. The LNA 20 is configured by using transistors with a gain bandwidth fT of 8 GHz, and operates on a DC supply voltage VDC of 10 V supplied from the DC voltage source 21.

The design specifications of the LNA 20 include a voltage gain of about 2 dB, a maximum feedback loop gain of 40 dB or higher, a phase margin of 30 degrees or greater, and are intended to be suitable for use in a case where an intense interfering signal input is present and a low gain, low distortion and a low noise figure are simultaneously demanded.

In the LNA 20, a signal source 22 with an output impedance of 50Ω is connected via a capacitor 23 to an input terminal IN to which one end of a feedback resistor 24 and the cold side of the secondary winding of a transformer 25 are connected. The transformer 25 has a turn ratio of 1:1. The other end of the feedback resistor 24 is connected to a negative differential output terminal NDO. The hot side of the secondary winding of the transformer 25 is connected to a positive differential output terminal PDO.

The primary winding of the transformer 25 has a hot side connected to the negative differential output terminal NDO, and a cold side connected to an input node NI of a cascode amplifier circuit. The input node NI is connected with the base of an NPN type transistor 27, which is the input stage of the cascode amplifier circuit. The base of the transistor 27 is connected with the positive electrode of a biasing DC voltage source 28 via a choke coil 29. A resistor 30 and a capacitor 31 are connected in series between the input node NI and the negative differential output terminal NDO as a first phase compensation network.

The collector of the transistor 27 is connected to the emitter of an NPN type transistor 32, which is the upper-stage transistor of the cascode amplifier circuit. The base of the transistor 32 is connected via a phase compensation resistor 34 to the positive electrode of a biasing DC voltage source 33. The resistor 34, together with a capacitor 35 connected between the base of the transistor 32 and the negative differential output terminal NDO, constitutes a second phase compensation network.

The collector of the transistor 32 is connected to the output node NO to which one end of the resistor 36 that is the load element of the cascode amplifier circuit is connected. The other end of the resistor 36 is connected to the DC voltage source 21 to be supplied with the DC supply voltage VDC.

The base of a transistor 37, i.e., the input side of the emitter follower is connected to the output node NO. The transistor 37 has a collector connected to the DC voltage source 21, and an emitter connected to the negative differential output terminal NDO. The negative differential output terminal NDO is connected to a constant current source 38. The constant current source 38 and the transistor 37 constitute an emitter follower, which operates as an output buffer circuit.

The positive differential output terminal PDO and the negative differential output terminal NDO are connected to the primary winding of an output transformer 41 via coupling capacitors 39 and 40, respectively. A load 42 comprising a resistor of 5 kΩ is connected to the secondary winding of the output transformer 41.

The following briefly describes the operation of the LNA 20.

The voltage signal to be applied to the input node NI becomes approximately zero when the feedback loop gain is high enough. Let the voltage on the negative differential output terminal NDO, at a time t, be Vn(t). Then the potential difference between both ends of the primary winding of the transformer 25, at the time t, Vd1(t), equals Vn(t)-0, that is, Vn(t). Since the turn ratio of the transformer 25 is 1:1, the potential difference between both ends of the secondary winding of the transformer 25, at the time t, Vd2(t), also equals Vn(t). The voltage on the positive differential output terminal PDO at the time t, Vp(t) can be calculated by adding the voltage of the signal supplied to the input terminal IN, Vin(t), and the above mentioned potential Vd2(t). The differential output voltage of the LNA 20, Vo(t), is given by the difference between Vp(t) and Vn(t), which is computed to be equal to Vin(t), with appropriate substitutions. Therefore, the voltage gain of the LNA 20 becomes 1 in an ideal case.

The output signal from the negative differential output terminal NDO is fed back to the input terminal IN via the feedback resistor 24, and is fed back to the input node NI of the cascode amplifier circuit via the primary winding of the transformer 25. The signal at the negative differential output terminal NDO is supplied to the input node NI of the cascode amplifier circuit via the phase compensation network, which comprises the resistor 30 and the capacitor 31.

Further, the signal at the negative differential output terminal NDO is supplied to the base of the transistor 32 of the cascode amplifier circuit via the phase compensation network, which comprises the resistor 34 and the capacitor 35. The differential output signal output from the positive differential output terminal PDO and the negative differential output terminal NDO is supplied to the load 42 via the transformer 41.

The transformer 25, having a turn ratio of 1:1, the secondary winding connected between the input terminal IN and the positive differential output terminal PDO, and the primary winding connected between the negative differential output terminal NDO and the input node NI of the cascade amplifier circuit, is used as a feedback network component in the LNA 20.

With the transformer 25 connected in the above manner, ideally, the differential output signal which has the same amplitude as the single-phase input signal applied to the input terminal IN appears between the two (positive and negative) differential output terminals NDO and PDO. This can cause the differential output signal to be fed back via the transformer 25 in series to the single-phase input signal. While the LNA 20 is configured as a buffer amplifier with the voltage gain of 0 dB, the input impedance is not completely matched, so that the voltage gain as the simulation result becomes about 2 dB.

The phase compensation resistor 30 and the capacitor 31 are connected to the base of the input-stage transistor 27 of the cascode amplifier circuit which comprises the transistor 27 and 32, and the resistor 36, and the phase compensation capacitor 35 and the resistor 34 are connected to the base of the upper-stage transistor 32. This can achieve sufficient phase compensation for the LNA 20.

The feedback resistor 24 connected between the input terminal IN and the negative differential output terminal NDO functions to enable shunt feedback of the negative differential output signal. In this example, when the output impedance of the signal source 22 is R, the optimal impedance matching can be achieved by setting the resistance value of the feedback resistor 24 to about the same value as R. It is to be noted however that with the value of an input-side reflection coefficient S11 representing the state of the input impedance matching is −10 dB or less, the specifications of the amplifier are normally satisfied, so that sufficient input impedance matching can be often achieved even if the resistance value of the feedback resistor 24 is set equal to or higher than R. The higher the resistance value of the feedback resistor 24 is, the lower the noise figure becomes, so that it is desirable to set the resistance value high while fulfilling the specifications of the input impedance matching.

In the LNA 20, while a differential signal is obtained as an output signal, the output impedances of the positive differential output terminal PDO and the negative differential output terminal NDO differ from each other. Particularly, while the output impedance of the negative differential output terminal NDO is sufficiently low, the output impedance of the positive differential output terminal PDO takes a higher value than that of the negative differential output terminal. When a next-stage circuit to be connected to the output side of the LNA 20 does not have a sufficiently high input impedance, therefore, it is desirable to connect an output buffer circuit comprising an emitter follower or the like to the positive differential output terminal PDO so that the output terminal of the output buffer circuit newly serves as the positive differential output terminal of the LNA 20.

In the LNA 20, as the input terminal IN and the positive differential output terminal PDO are connected directly by the secondary winding of the transformer 25, the characteristic of a reverse-directional voltage gain S12 does not become a very low value. When a low S12 value is required, therefore, it is desirable to connect an output buffer circuit comprising an emitter follower or the like to the positive differential output terminal PDO so that the output terminal of the output buffer circuit newly serves as the positive differential output terminal of the LNA 20.

It is necessary to utilize a transformer with adequate characteristics for the transformer 25 in the LNA 20, to reduce the noise figure (referred to as NF, hereinafter) in the high frequency band, thereby realizing a wide band, high dynamic range LNA.

Figure 2:
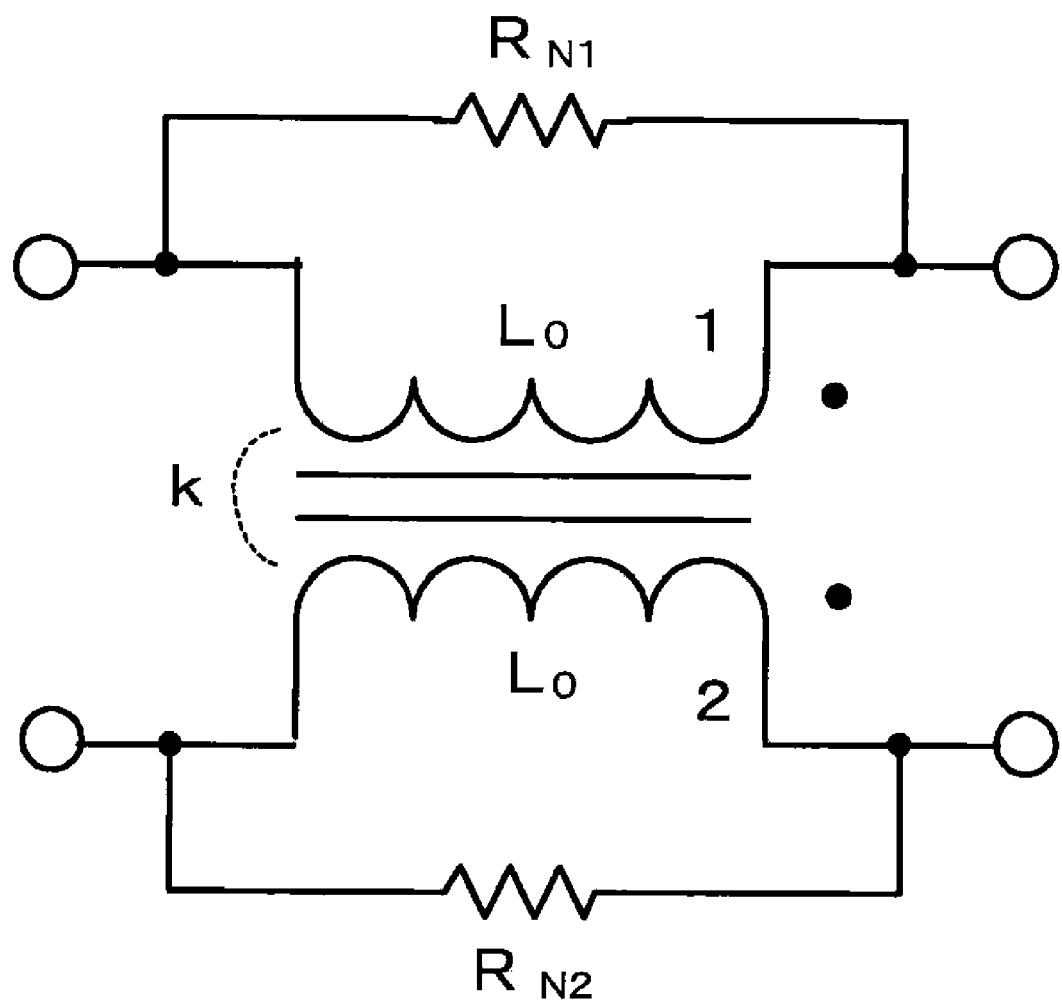
FIG. 2 shows a model circuit of a transformer in FIG. 1.

As shown in FIG. 2, the model circuit of the transformer 25 in FIG. 1 is represented by two windings coupled with a coupling coefficient k at a turn ratio of 1:1. The inductance of each winding is $L_0$. $R_{N1}$ and $R_{N2}$ are parasitic resistor elements of the primary winding and the secondary winding, respectively.

Let us now consider the influence of the thermal noise produced from the parasitic resistors of the transformer 25 in FIG. 1 on the differential output signal.

First, in consideration of thermal noise produced from the parasitic resistor $R_{N1}$ of the primary winding of the transformer 25, both ends of the parasitic resistor $R_{N1}$ can appear to be short-circuited by the parasitic capacitor C between the base and collector of the transistor 27 in a high frequency band. As the frequency becomes higher, therefore, the contribution of the thermal noise becomes smaller. No further consideration is therefore made.

Next, let us consider the thermal noise produced from the parasitic resistor $R_{N2}$ of the secondary winding of the transformer 25. Assuming that the transistor 27 has a sufficient high transconductance in the considered frequency range, the thermal noise, which appears in the differential output voltage signal due to the parasitic resistor $R_{N2}$ is expressed by the following equation 1.

$$H(s) = H_0 \frac{1 + \frac{s}{Q_z \omega_z} + \frac{s^2}{\omega_z^2}}{1 + \frac{s}{Q_p \omega_p} + \frac{s^2}{\omega_p^2}} (V/\sqrt{H} z), \quad \text{(equation 1)}$$

$$H_0 = \frac{R_{FB} \| R_L \| R_S}{2R_{FB} + \frac{R_N}{R_L}(R_{FB} \| R_L \| R_S)} \sqrt{4 k_B T R_N},$$

-continued $$\omega_z = \frac{1}{\sqrt{LC\left(1+\frac{R_{FB}}{R_S}\right)}},$$

$$Q_z = \sqrt{\frac{C}{L}} \frac{R_N}{\sqrt{1+\frac{R_{FB}}{R_S}}},$$

$$\omega_p = \sqrt{\frac{2}{LC}} \sqrt{\frac{1+\frac{R_L}{R_{FB}\|R_S}+\frac{R_N}{2R_{FB}}}{1+\frac{R_N+R_L}{R_{FB}\|R_S}}},$$

$$\frac{1}{Q_p\omega_p} =$$

$$\frac{L}{2R_N} \frac{1+\frac{R_N+R_L}{R_S\|R_{FB}}}{1+\frac{R_L}{R_S\|R_{FB}}+\frac{R_N}{2R_{FB}}} + \frac{CR_N}{2} \frac{1}{1+\frac{R_N(R_S\|R_{FB}\|R_L)}{2R_{FB}R_L}}.$$

where

L is the leakage inductance of the transformer 25 which has a value of $L=(1-k^2)L_0$, $R_N$ is the resistance value of the parasitic resistor of the transformer winding, $R_S$ is the value of the output impedance of the signal source 22, $R_{FB}$ is the resistance value of the feedback resistor 24, $R_L$ is the resistance value of the load 42, C is the capacitance of the parasitic capacitor between the base and collector of the transistor 27, $k_B$ is the Boltzmann's constant, and T is the absolute temperature (K).

As apparent from the equation 1, $\omega_p > \omega_z$ is normally satisfied. When $R_N$, $R_S$, $R_{FB}$ and $R_L$ having typical values are used, $Q_P$ does not take a very high value. Therefore, when a transformer with such a characteristic that $Q_Z$ has a high value in the frequency range where the transistor 27 functions well is used, a notch appears in the noise transfer function H(s) at a frequency near $\omega_z$, where the noise voltage at the output terminal, which is originated from the thermal noise produced by the transformer, drastically falls. Setting $\omega_z$ high can suppress the noise voltage up to a certain high frequency.

The noise power, which appears in the output signal of the LNA 20, is the sum of the noise power component produced from the transformer 25 and the noise power component produced from other parts. The noise figure is a value estimated with the thermal noise power of the signal source 22 and the input-referred noise power of the amplifier. While the value computed through the equation 1 does not directly correspond to the NF, the frequency characteristic curve of the NF is generally dented around the frequency $\omega_z$, due to the above-explained notch in H(S).

Next, the performance of the LNA 20 is described based on simulation results.

Figure 3A:
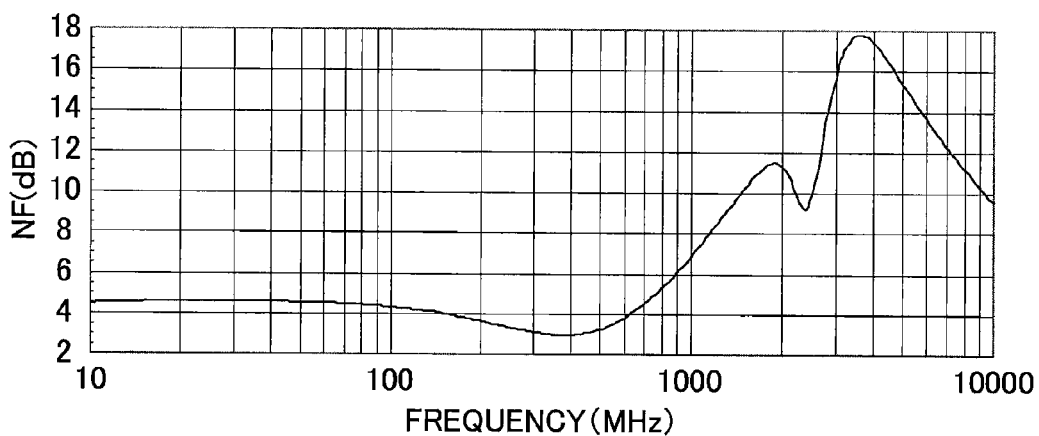
FIG. 3A is a diagram showing simulation results for a noise figure of the LNA in FIG. 1.
Figure 3B:
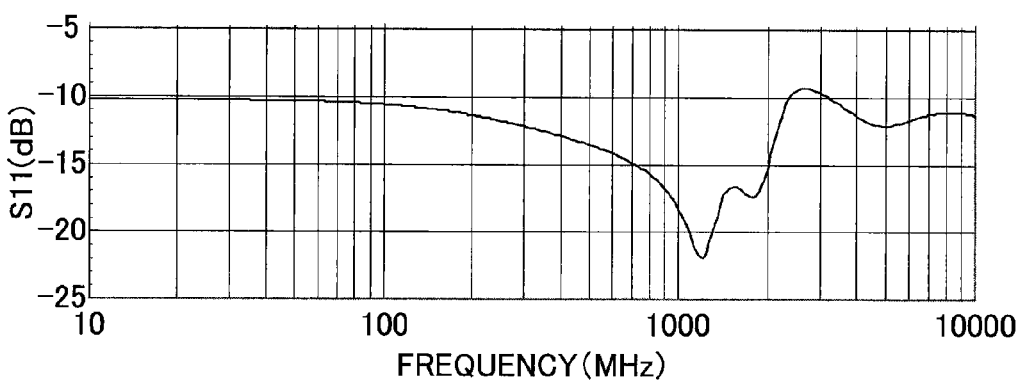
FIG. 3B is a diagram showing simulation results for an input-side reflection coefficient of the LNA in FIG. 1.
Figure 3C:
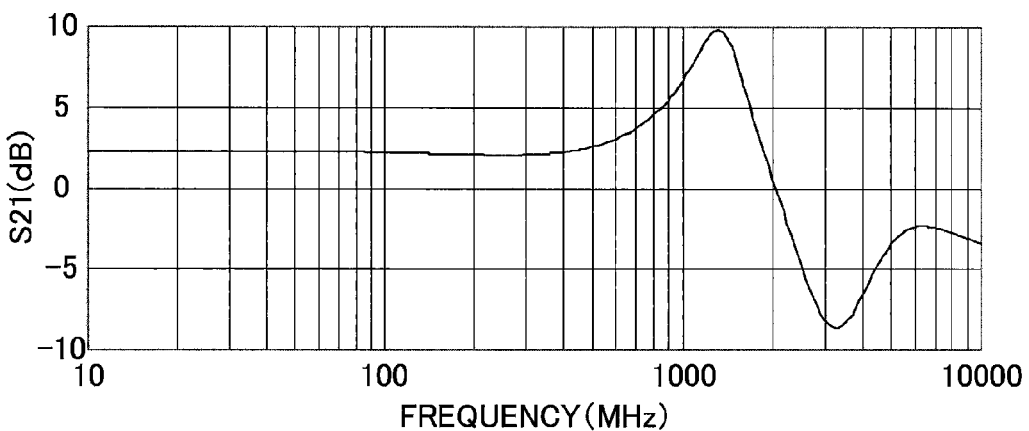
FIG. 3C is a diagram showing simulation results for a voltage gain of the LNA in FIG. 1.

FIGS. 3A to 3C are diagrams showing simulation results for the noise figure NF, the input-side reflection coefficient S11 and the voltage gain S21 of the LNA 20 in FIG. 1.

Looking at the frequency characteristic of the voltage gain S21, it is understood that a stable gain of 2 to 3 dB is obtained in a frequency band of 600 MHz or lower, and the amplifier has a stable gain in a wide band up to 600 MHz. The value of the input-side reflection coefficient S11 falls down to −10 dB or below in a wide frequency band, achieving satisfactory input impedance matching. S11 is allowed to increase up to the specification value, −10 dB, in the low frequency band, by setting the resistance value of the feedback resistor 24 as high as possible, thereby decreasing the NF to the minimum. In a case that S11 is of high priority in the design, rather than the NF, it is possible to lower S11 below −10 dB in the low frequency band, by allowing the NF to be deteriorated.

The NF becomes a minimum value of 3 dB near 370 MHz, and becomes 4 dB or lower in the range of 150 to 630 MHz, and is 4.6 dB or lower in the frequency band below 630 MHz. The NF taking a value of 4 dB or so indicates a good noise characteristic in consideration of the voltage gain S21 of 2 dB. As shown in the diagrams, the feature of the LNA 20 lies in that a frequency region where the NF locally falls occurs in the high frequency band, which means that the upper limit of operating frequency range of the LNA 20 becomes higher than that of the conventional LNA whose NF shows monotonic increase with frequency.

Figure 4:
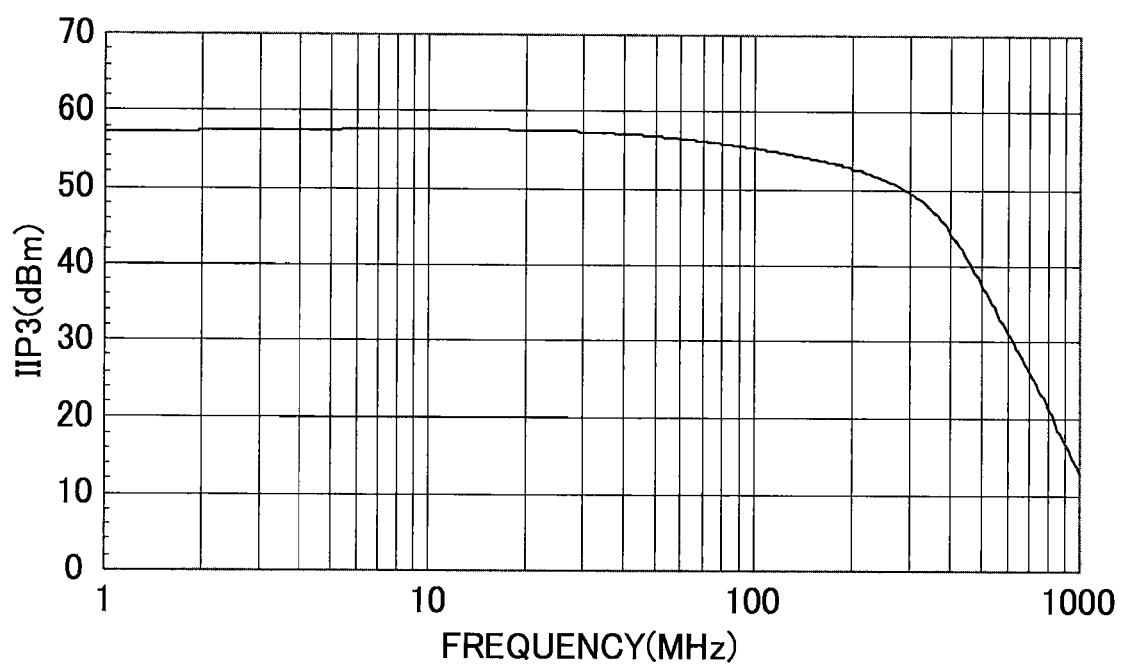
FIG. 4 is a diagram showing simulation results for the IIP3 characteristic of the LNA in FIG. 1.

FIG. 4 is a diagram showing simulation results for the IIP3 characteristic of the LNA 20 in FIG. 1, the abscissa representing the frequency (MHz) while the ordinate represents the IIP3 (dBm). In the simulation of the IIP3 characteristic, two tone signals having power of −50 dBm at a frequency apart by 10 kHz from the measuring frequency are input.

It is understood from FIG. 4 that IIP3 equal to or higher than +50 dBm is kept up to about 300 MHz, and IIP3 equal to or higher than +30 dBm is obtained below 600 MHz. The feedback loop gain of the LNA 20 is less affected by parasitic capacitors in the circuit, such as that of the transformer 25. In other words, it is possible to shift the cut-off frequency of the feedback loop gain to a higher frequency than that of conventional amplifiers, by adjusting the circuit constants of the phase compensation network, without relaxing the phase and gain margin specifications. This makes it possible to keep the feedback loop gain high up to a higher frequency than is achieved conventionally, and achieve a high IIP3 value. Particularly, the LNA 20 has the voltage gain set to a low value of about 2 dB, contributing to increase the value of IIP3.

Figure 5:
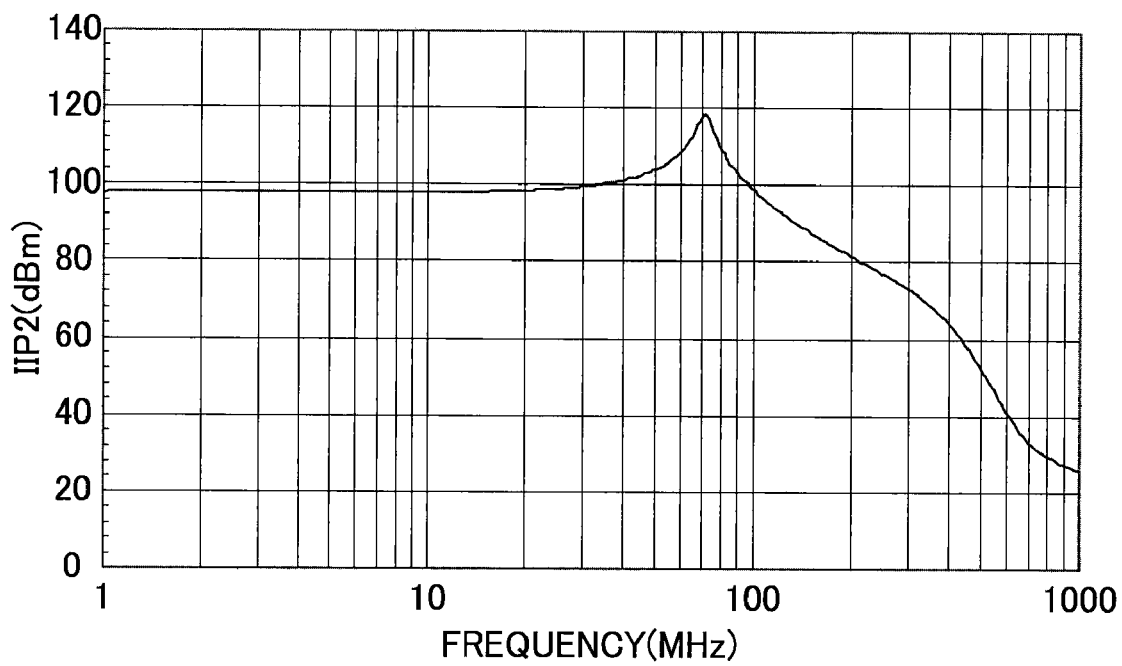
FIG. 5 is a diagram showing simulation results for the IIP2 characteristic of the LNA in FIG. 1.

FIG. 5 is a diagram showing simulation results for the second order input intercept point (hereinafter referred to as "IIP2") characteristic of the LNA 20 in FIG. 1, the abscissa representing the frequency (MHz) while the ordinate represents the IIP2 (dBm). The simulation of the IIP2 characteristic is carried out under the same conditions for the simulation of the IIP3 characteristic in FIG. 4.

As shown in FIG. 5, IIP2 of +96 dBm or higher is kept up to 100 MHz, and IIP2 of +50 dBm or higher is obtained under 500 MHz, which shows that a good IIP2 characteristic is achieved in a wide band.

As described above, even when the cut-off frequency of the feedback loop gain is set high by reducing the resistance of the phase compensation resistor and the capacitance of the phase compensation capacitor, the LNA 20 according to the first embodiment has an advantage such that it can perform a stable operation while maintaining a low noise figure and high IIP3 and IIP2 values, and keep a high dynamic range.

Further, the conventional differential LNA needs two sets of amplifying sections in order to output the differential output signal, and thus needs a circuit die area and power consumption roughly twice as large as those of the single-ended amplifier having an equivalent performance, whereas the LNA 20 of the embodiment uses the transformer 25 to generate the differential signal, and thus has an advantage such that the differential signal can be generated by hardly increasing the circuit die area and the power consumption as compared with the single-ended amplifier having an equivalent performance, providing a good even-order distortion characteristic. It is to be noted that while most of differential amplifiers output a differential as well as balanced amplified signal, the LNA 20 outputs an unbalanced differential amplified signal. Many of the advantages of the differential signal processing are satisfied regardless of the signal balance, so that the above point does not become a particularly significant disadvantage.

Because the turn ratio of the transformer 25 is set to 1:1 in the LNA 20, the voltage gain theoretically becomes 0 dB. In this respect, the LNA 20 is not suitable for the usage that demands a voltage gain higher than 0 dB.

Second Embodiment

While the foregoing description of the first embodiment has been given of the LNA 20, which hardly has a voltage gain (2 dB or lower), the embodiment cannot be adapted to a case where a meaningful amount of voltage gain is needed. The following description of a second embodiment is given of an LNA 20A, which has a higher voltage gain.

Figure 6:
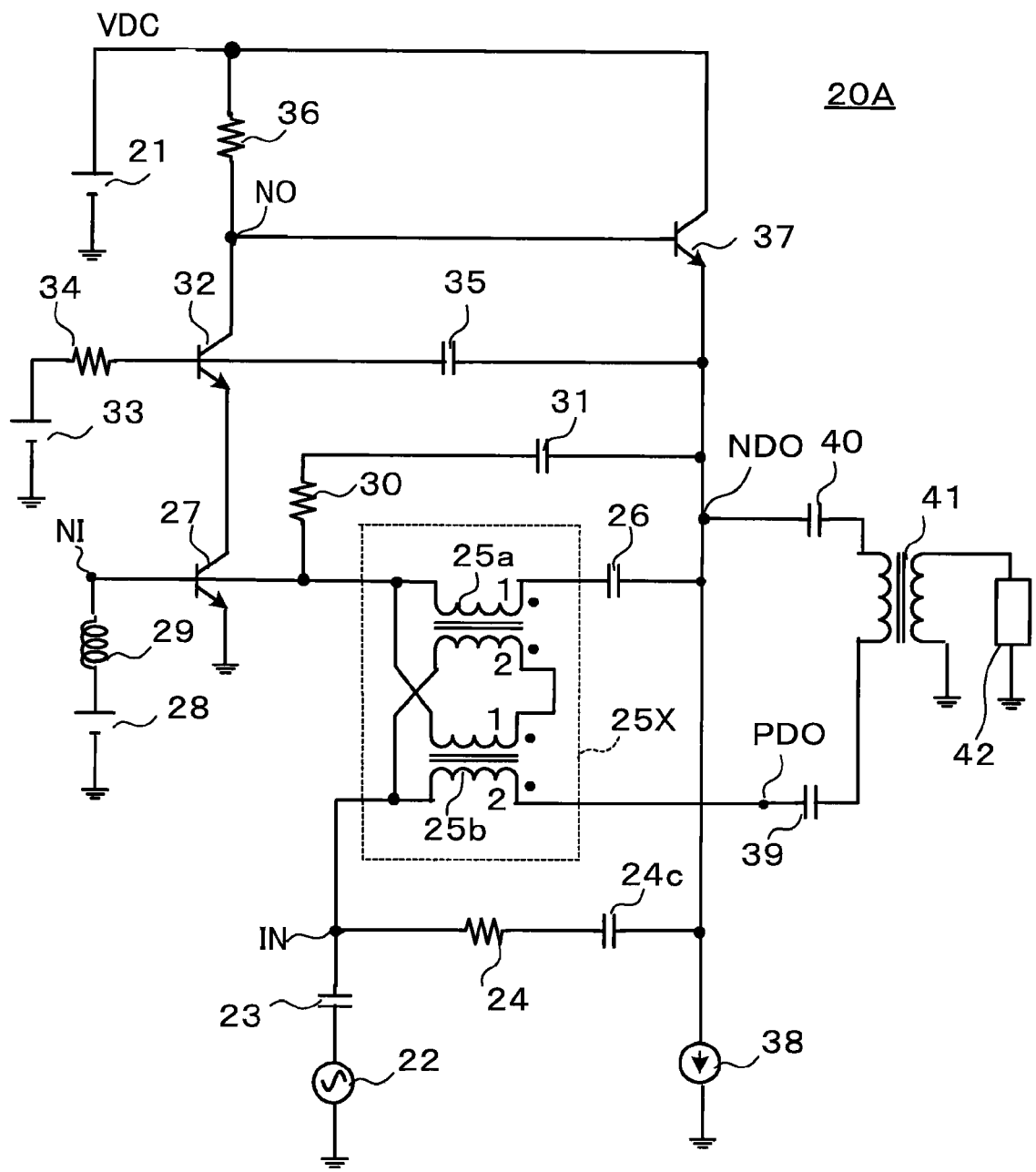
FIG. 6 is a circuit diagram showing an LNA according to a second embodiment of the invention.

As shown in FIG. 6, like the LNA 20 in FIG. 1, the LNA 20A according to the second embodiment of the invention operates on the DC supply voltage VDC of 10 V supplied from the DC voltage source DCS, and is configured by using transistors with a gain bandwidth fT of 8 GHz. The design specifications include a voltage gain of about 8 dB, a maximum feedback loop gain of 40 dB or higher, and a phase margin of 30 degrees or greater.

The LNA 20A uses a transformer 25X configured to have a combination of two transformers 25a and 25b in place of the transformer 25 in the LNA 20 in FIG. 1. The transformers 25a and 25b each have a turn ratio of 1:1, and constitute a so-called pair type transformer which is generally produced as an integrated transformer using a multi-aperture core or the like, and have the same characteristic.

The secondary winding of the transformer 25b has the cold side connected to the input terminal IN, and the hot side connected to the positive differential output terminal PDO. The primary winding of the transformer 25a has the hot side connected via the capacitor 26 to the negative differential output terminal NDO, and has the cold side connected to the input node NI of the cascode amplifier section. Further, the hot sides of the secondary winding of the transformer 25a and the primary winding of the transformer 25b are connected together. The cold side of the secondary winding of the transformer 25a is connected to the cold side of the secondary winding of the transformer 25b, and the cold side of the primary winding of the transformer 25b is connected to the cold side of the primary winding of the transformer 25a. Further, a feedback network that comprises the feedback resistor 24 and a coupling capacitor 24c is connected between the negative differential output terminal NDO and the input terminal IN. The other configuration is the same as that shown in FIG. 1.

As the transformers 25a and 25b are connected in the above manner, the differential output signal whose amplitude is ideally twice the amplitude of the single-phase input signal applied to the input terminal IN appears between the two positive and negative differential output terminals PDO and NDO. This makes it possible to feed back the differential output signal in series to the single-phase input signal via the transformers 25a and 25b.

While the LNA 20A is configured as an amplifier with the voltage gain of 6 dB, the input impedance is not completely matched, so that the voltage gain as the simulation result becomes about 8 dB.

The feedback resistor 24 connected between the input terminal IN and the negative differential output terminal NDO functions to enable shunt feedback of the negative differential output signal. In this example, when the output impedance of the signal source 22 is R, the optimal input impedance matching can be achieved by setting the resistance value of the feedback resistor 24 to about 2 R.

It is to be noted however that when the value of the parameter S11 representing the state of the input impedance matching is −10 dB or less, the specifications of the amplifier are normally satisfied, so that sufficient input impedance matching can be often achieved even if the resistance value of the feedback resistor 24 is set equal to or higher than 2 R. The higher the resistance value of the feedback resistor 24 becomes, the lower the noise figure becomes, so that it is desirable to set the resistance value high while fulfilling the specifications of the input impedance matching.

Note that the LNA 20A can carry out sufficient phase compensation with the phase compensation resistors and capacitors, as per the LNA 20 in FIG. 1. The output impedance of the positive differential output terminal PDO is higher than that of the negative differential output terminal NDO which corresponds to the output of the emitter follower. When a next-stage circuit to be connected to the output side of the LNA 20A does not have a sufficiently high input impedance, therefore, it is desirable to connect an output buffer circuit comprising an emitter follower or the like to the positive differential output terminal PDO.

Further, in the LNA 20A, as the input terminal IN and the positive differential output terminal PDO are connected directly by the secondary winding of the transformer 25b, the S12 representing the reverse-directional voltage gain does not become a very low value. When a low S12 value is required, therefore, it is desirable to connect an output buffer circuit comprising an emitter follower or the like to the positive differential output terminal PDO.

Figure 7A:
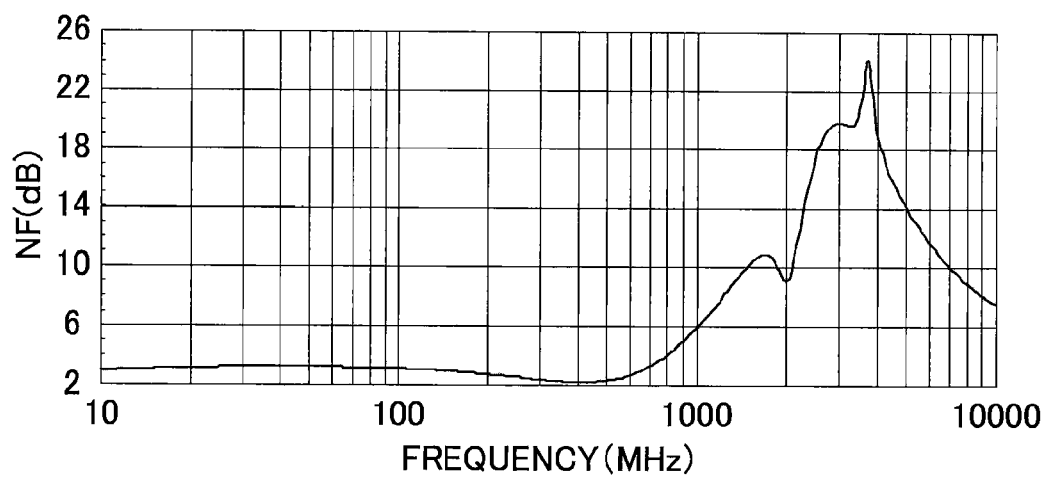
FIG. 7A is a diagram showing simulation results for a noise figure of the LNA in FIG. 6.
Figure 7B:
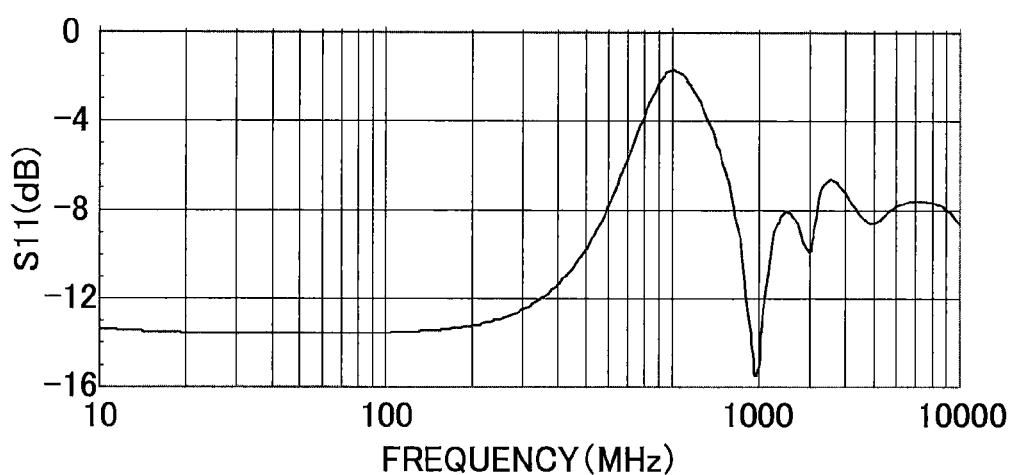
FIG. 7B is a diagram showing simulation results for an input-side reflection coefficient of the LNA in FIG. 6.
Figure 7C:
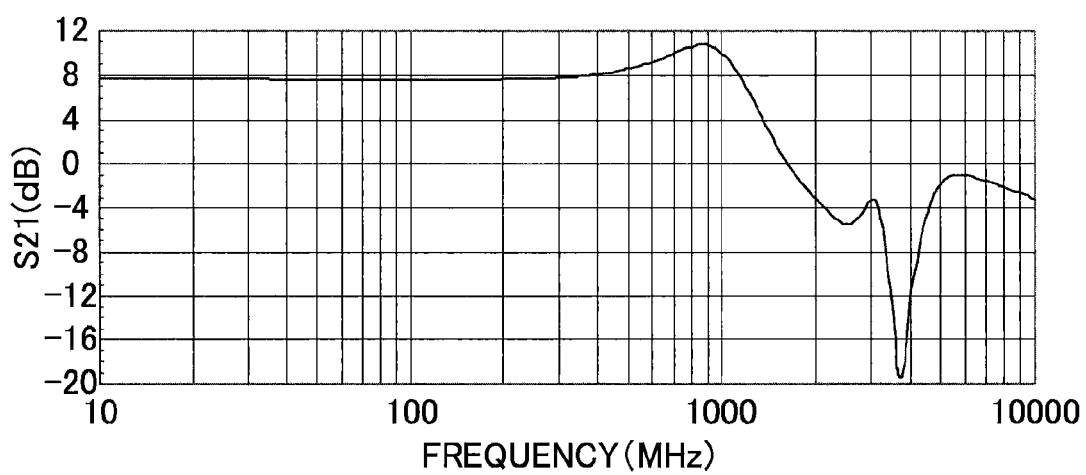
FIG. 7C is a diagram showing simulation results for a voltage gain of the LNA in FIG. 6.

Next, the performance of the LNA 20A is described based on simulation results shown in FIGS. 7A to 7C.

First, looking at the frequency characteristic of the voltage gain S21, it is understood that the LNA 20A operates with a stable gain of 7.6 to 8.6 dB in a wide frequency band up to 500 MHz. The LNA 20A can increase the voltage gain to 8 dB or so by using the pair type transformer 25X, whereas the LNA 20 in FIG. 1 has a voltage gain of about 2 dB.

The value of the input-side reflection coefficient S11 falls down to −10 dB or below in a frequency band of 500 MHz or lower, achieving satisfactory input impedance matching. S11 is allowed to increase up to the specification value, −10 dB, in the operating frequency band, i.e. below 500 MHz, by setting the resistance value of the feedback resistor 24 as high as possible, thereby decreasing the NF to the minimum.

The noise figure takes a minimum value of 2.2 dB near 410 MHz, and becomes 3.2 dB or lower in the range of 610 MHz or lower. It is apparent from comparison of the frequency characteristics of the noise figure of the LNAs 20 and 20A with each other that when each amplifier uses a transformer having an adequate characteristic, a region where the frequency characteristic of the NF locally decrease occurs in the high frequency band, which means that the upper limit of operating frequency range of the LNAs 20 and 20A become higher than that of the conventional LNA whose NF shows monotonic increase with frequency.

Figure 8:
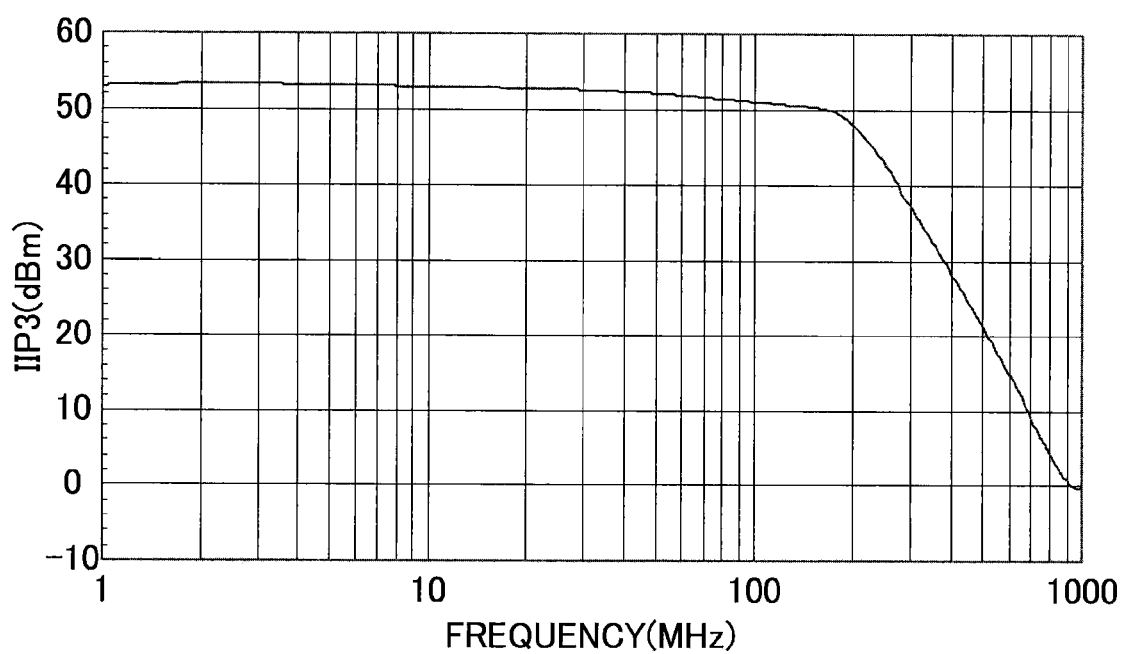
FIG. 8 is a diagram showing simulation results for the IIP3 characteristic of the LNA in FIG. 6.
Figure 9:
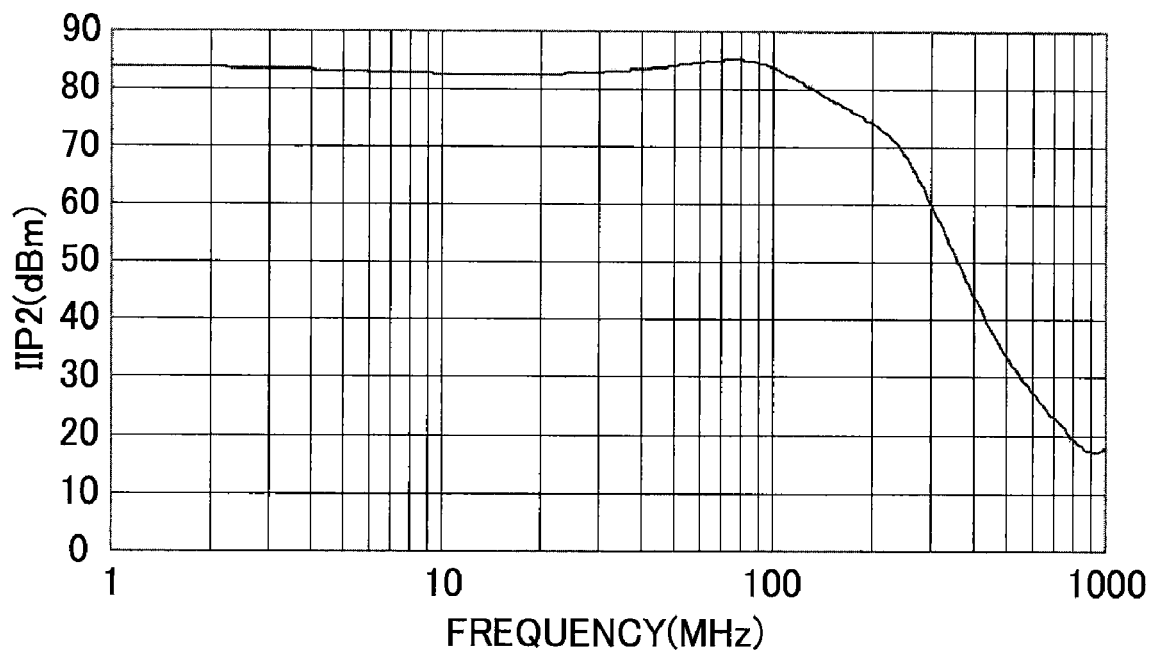
FIG. 9 is a diagram showing simulation results for the IIP2 characteristic of the LNA in FIG. 6.

FIGS. 8 and 9 are diagrams showing simulation results for the IIP3 characteristic and the IIP2 characteristic of the LNA 20A in FIG. 6; the simulation conditions are the same as those in the case of FIG. 4.

As shown in FIG. 8, IIP3 equal to or higher than +50 dBm is kept up to about 170 MHz, and IIP3 equal to or higher than +20 dBm is obtained at 500 MHz. The feedback loop gain of the LNA 20A is less affected by parasitic capacitors in the circuit, such as that of the transformer 25X. In other words, it is possible to shift the cut-off frequency of the feedback loop gain to a higher frequency than that of conventional LNAs, by adjusting the circuit constants of the compensation network, without relaxing the phase and gain margin specifications. This makes it possible to keep the feedback loop gain high up to a higher frequency than is achieved conventionally, and achieve a high IIP3 value. As shown in FIG. 9, IIP2 of +70 dBm or higher is kept up to about 240 MHz, and IIP2 of +30 dBm or higher is obtained under 500 MHz, which shows that a good IIP2 characteristic is achieved in a wide band.

Figure 10:
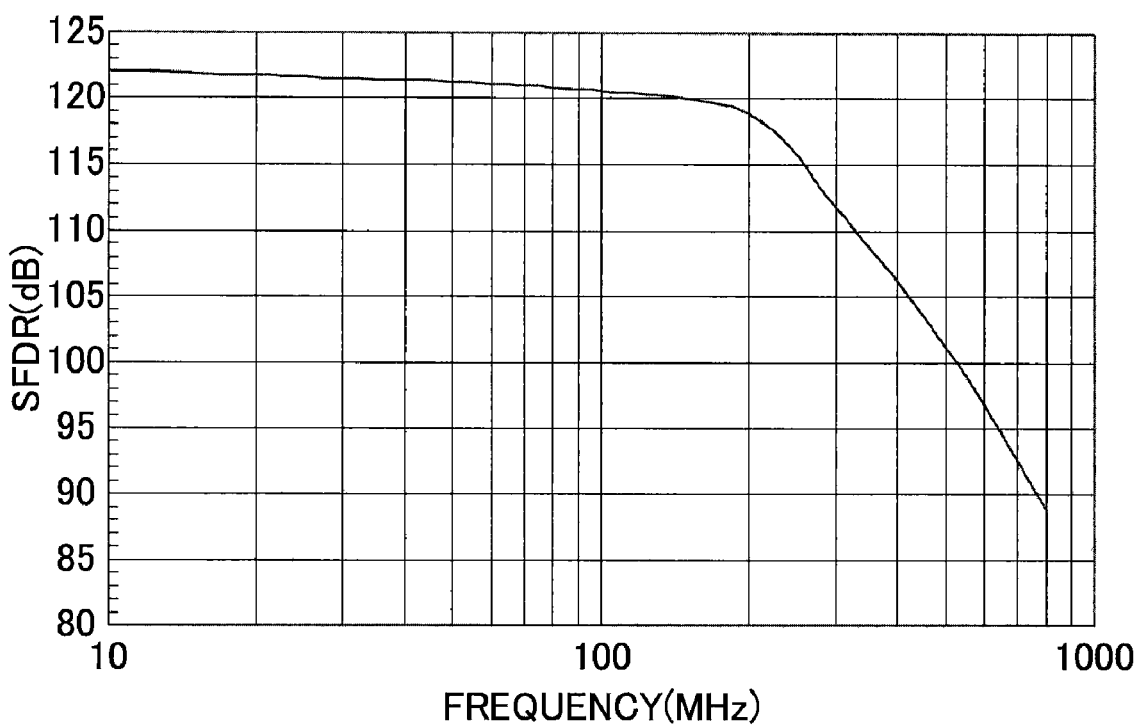
FIG. 10 is a diagram showing simulation results for the SFDR characteristic of the LNA in FIG. 6.

FIG. 10 is a diagram showing the spurious free dynamic range (hereinafter referred to as "SFDR") characteristic of the LNA 20A derived from simulation results, the abscissa representing the frequency (MHz) while the ordinate represents the SFDR (dB). The computation of the SFDR characteristic is carried out over the frequency range of 10 to 800 MHz with an ambient temperature of 300 K, and assuming the band width of the input signal form the signal source 22 to be 12.5 kHz.

It is apparent from FIG. 10 that the SFDR value of 100 dB or higher is obtained at a frequency of 500 MHz or lower.

As described above, the LNA 20A of the second embodiment has an advantage such that the use of the pair type transformer 25X as a part of feedback network can provide a voltage gain of 6 dB or higher in addition to the advantages, like those of the first embodiment, the differential signal can be generated by hardly increasing the circuit area and the power consumption as compared with the single-ended amplifier having an equivalent performance, and the amplifier can function stably while maintaining a low noise figure and high IIP3 value and IIP2 value, i.e., while maintaining a high dynamic range.

Third Embodiment

Figure 11:
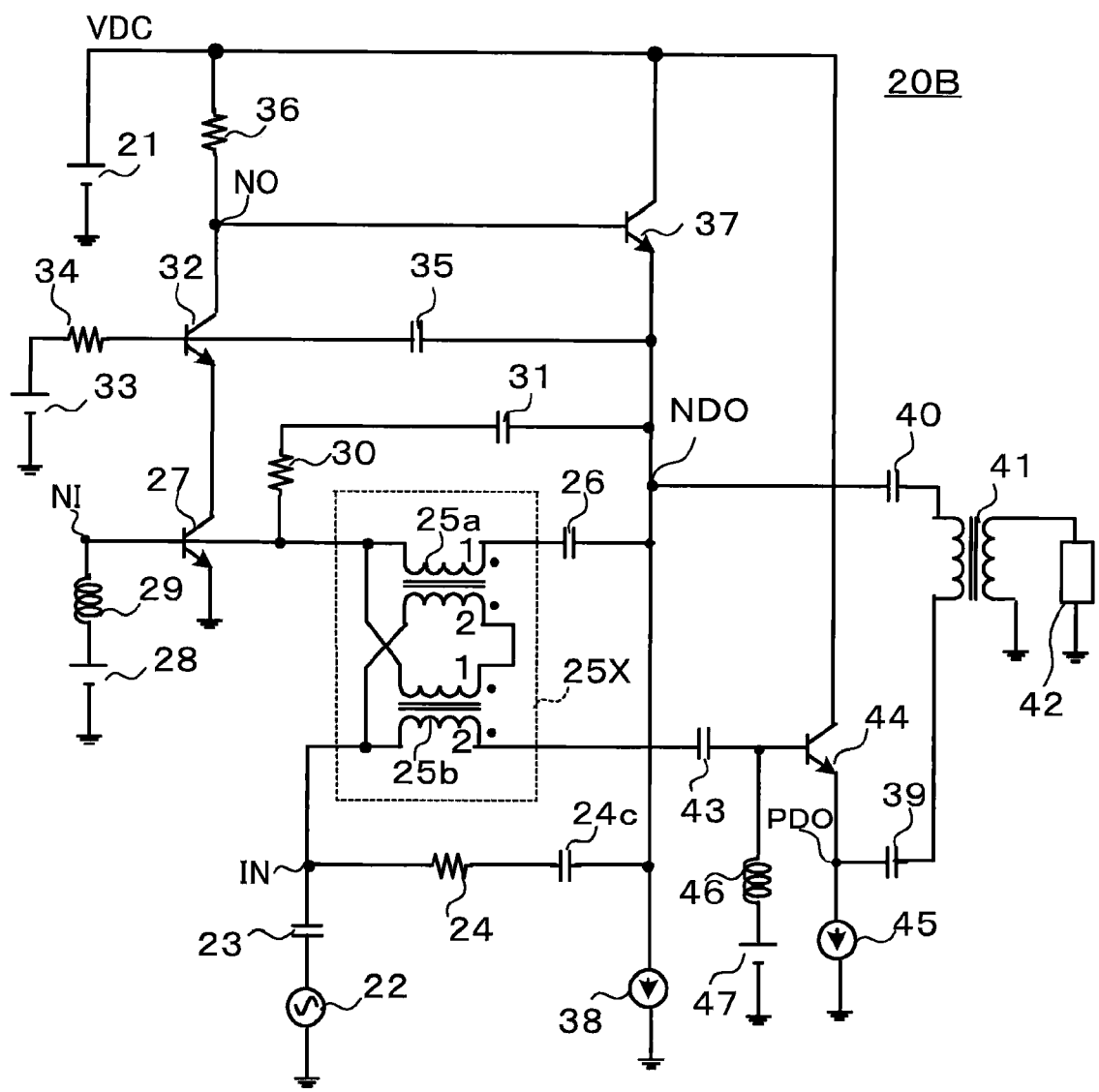
FIG. 11 is a circuit diagram showing an LNA according to a third embodiment of the invention.

As shown in FIG. 11, an LNA 20B according to a third embodiment of the invention is a modification to the LNA 20A in FIG. 6 to which an output buffer is added to lower the output impedance of the positive differential output terminal PDO of the LNA 20A. That is, the hot side of the secondary winding of the transformer 25b is connected via a coupling the capacitor 43 to the base of a transistor 44. The transistor 44 has a collector supplied with the DC supply voltage VDC from the DC voltage source 21, and an emitter connected to a constant current source 45.

A biasing DC voltage source 47 is connected to the base of the transistor 44 via a choke coil 46. The transistor 44 and the constant current source 45 constitute an emitter follower, which operates as an output buffer circuit. This makes it possible to reduce the value of the output impedance of the positive differential output terminal PDO which corresponds to the emitter of the transistor 44 and reduce the value of the reverse-directional voltage gain S12 at the same time. Because noise figure may be deteriorated by the noise generated from the transistor 44 of the added output buffer circuit, it is necessary to use a transistor with as lower noise as possible.

Fourth Embodiment

Figure 12:
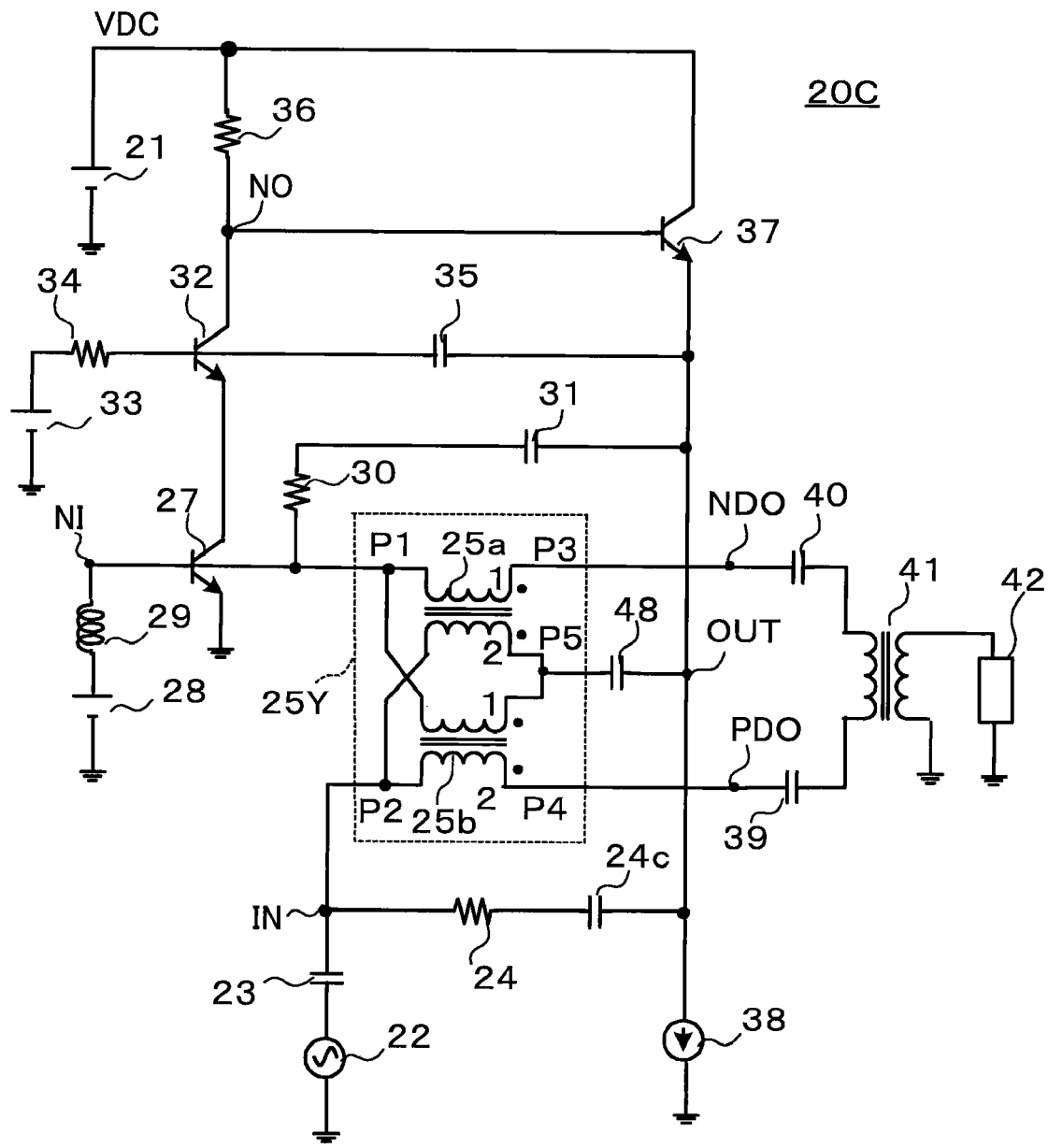
FIG. 12 is a circuit diagram showing an LNA according to a fourth embodiment of the invention.

As shown in FIG. 12, an LNA 20C according to a fourth embodiment of the invention fundamentally has a circuit form similar to that of the LNA 20A in FIG. 6, with a modification made to a transformer 25Y which comprises a part of feedback network of the LNA.

In other words, the transformer 25Y is configured to have a combination of two transformers 25a and 25b to provide a center tap. The transformers 25a and 25b each have a turn ratio of 1:1, are a so-called pair type transformer which is generally produced as an integrated transformer using a multi-aperture core or the like, and have the same characteristics.

The secondary winding of the transformer 25b has the cold side connected to the input terminal IN, and the hot side connected to the positive differential output terminal PDO. The primary winding of the transformer 25a has the hot side connected to the negative differential output terminal NDO, and has the cold side connected to the input node NI of the cascode amplifier section. Further, the hot sides of the secondary winding of the transformer 25a and the primary winding of the transformer 25b are connected together to be a center tap. The center tap is connected via a coupling capacitor 48 to the emitter of the transistor 37 or the output terminal OUT of the emitter follower.

The cold side of the secondary winding of the transformer 25a is connected to the cold side of the secondary winding of the transformer 25b, and the cold side of the primary winding of the transformer 25b is connected to the cold side of the primary winding of the transformer 25a. The primary winding of the output transformer 41 is connected to the positive different output terminal PDO and the negative differential output terminal NDO via the capacitors 39 and 40, respectively. The other configuration is the same as that shown in FIG. 1.

As compared with the LNA 20 in the FIG. 1, an advantage of the LNA 20C is that its S11 as well as the NF can be reduced in a high frequency region, by utilizing a transformer with adequate characteristics for the transformer 25Y in the LNA 20C, without impairing the dynamic range and other characteristics.

The following describes the characteristic necessary for the transformer 25Y using a simple model circuit.

Figure 13:
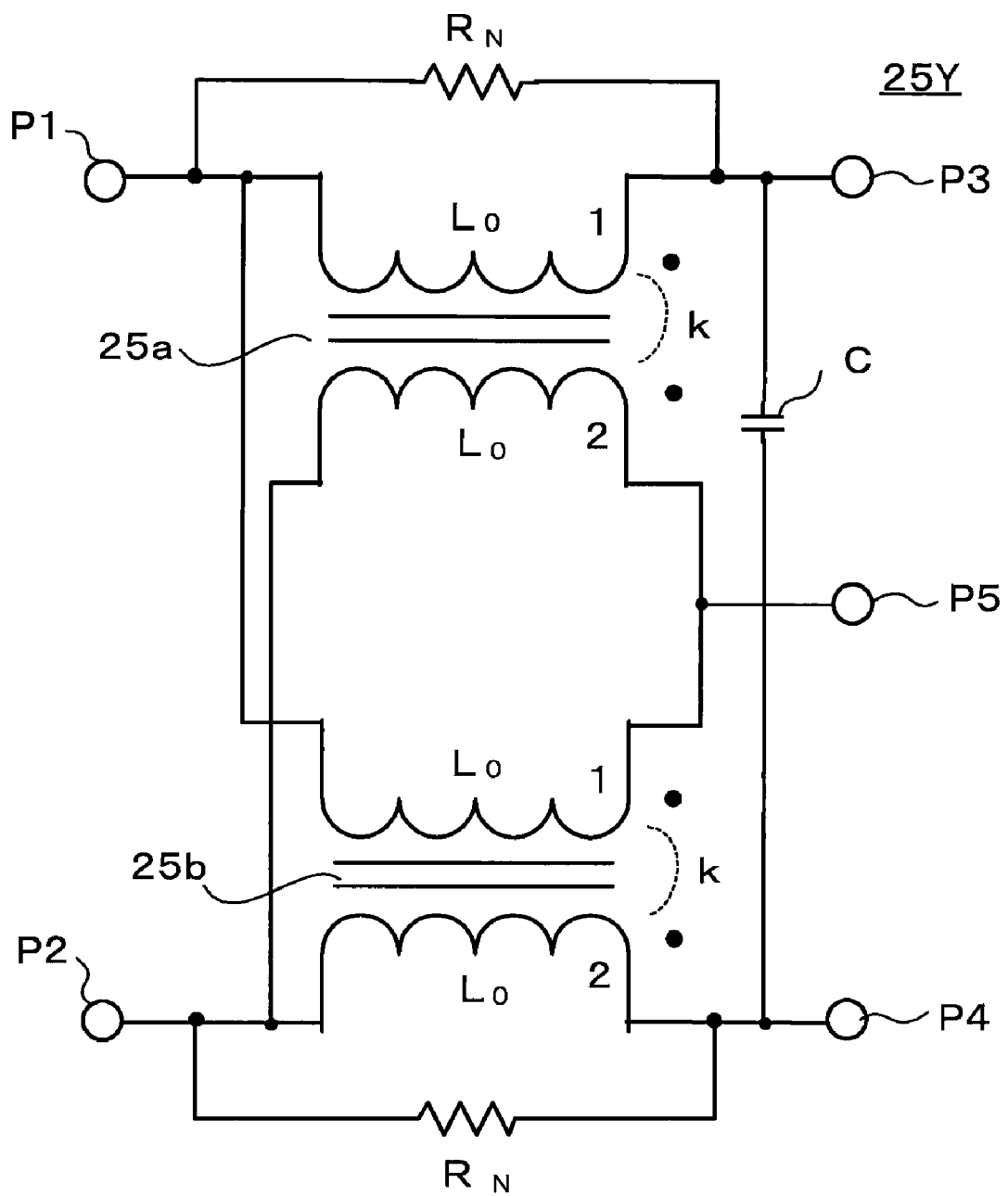
FIG. 13 shows a model circuit of a transformer in FIG. 12.

As shown in FIG. 13, a transformer 25a comprises two coils with an inductance $L_O$, which are magnetically coupled with a coupling coefficient k. Although a transformer 25b actually has the same characteristic as the transformer 25a because of the symmetry, it is assumed to be an ideal transformer having a zero leakage inductance to simplify the analysis.

In FIG. 13, the resistor $R_N$ is the parasitic resistor of the transformer winding, and the capacitor C represents the parasitic capacitor between the windings of the transformer. Terminals P1, P2, P3, P4 and P5 in FIG. 13 are respectively connected to the input node NI, the input terminal IN, the negative differential output terminal NDO, the positive differential output terminal PDO and the output terminal OUT in FIG. 12.

Analytical expression of the input impedance of the LNA 20C in FIG. 12 using this model circuit yields the following equation 2, which is satisfied in a frequency range where the input-stage transistor 27 has a substantially high transconductance.

$$H(s) = H_1 \frac{1 + \frac{s}{Q_{z1}\omega_{z1}} + \frac{s^2}{\omega_{z1}^2}}{1 + \frac{s}{Q_{p1}\omega_{p1}} + \frac{s^2}{\omega_{p1}^2}} (\Omega), \quad \text{(equation 2)}$$

$$H_1 = \left( \frac{2 + \frac{R_N}{R_{FB}}}{R_N \| \frac{R_L}{4}} - \frac{1}{R_N} \right)^{-1},$$

$$\omega_{z1} = \frac{1}{\sqrt{3LC}},$$

$$Q_{z1} = \sqrt{\frac{3C}{L}} \left( R_N \| \frac{R_L}{3} \right),$$

$$\omega_{p1} = \sqrt{\frac{1}{LC} \frac{R_N}{R_L \|(5R_N + R_{FB})}} \sqrt{\frac{1 - 2\frac{R_N - R_{FB}}{6R_N + R_L} + \frac{R_{FB}}{R_N}}{1 + \frac{R_N - R_{FB}}{6R_N + R_L}}},$$

$$\frac{1}{Q_{p1}\omega_{p1}} = \frac{L}{R_N} \frac{1 - \frac{R_N - R_{FB}}{6R_N + R_L}}{1 - 2\frac{R_N - R_{FB}}{6R_N + R_L} + \frac{R_{FB}}{R_N}} +$$

$$C(R_L \| 4(R_N + R_N \| R_{FB})).$$

where

L is the leakage inductance of the transformer 25a, which has a value of $L=(1-k^2)L_0$, $R_N$ is the resistance value of the parasitic resistor of the transformer winding, $R_{FB}$ is the resistance value of the feedback resistor 24, $R_L$ is the resistance value of the load 42, and C is the capacitance of the parasitic capacitor between the windings of the transformer 25Y.

When $R_N$, $R_{FB}$, $R_L$, L and C having typical values are substituted in the equation 2, $Q_{P1}$ does not take a very high value, and $\omega_{p1} > \omega_{z1}$ is normally fulfilled. It can be easily recognized by examining the form of equation 2 that if the value of $Q_{z1}$ is sufficiently high, a notch will appear in the frequency characteristic of the input impedance around the frequency $\omega_{z1}$. The asymptotic input impedance in the high frequency limit, $H_1$ in the equation 2 becomes generally higher than the standard output impedance of the input signal source, 50Ω, when substituted with typical values for parasitic components. Therefore, the frequency characteristic of the input impedance matching of the LNA 20C is usually improved around the frequency $\omega_{z1}$, where the value of input impedance becomes lower due to the above-mentioned notch. As apparent from the equation of $Q_{Z1}$, to make $Q_{Z1}$ higher, it is desirable to use a transformer having a larger parasitic capacitance C, a smaller leakage inductance L, and a larger parasitic resistance $R_N$. It is also preferable to set the load resistance $R_L$ at least several times higher than $R_N$. Also, to increase the frequency of the notch $\omega_{z1}$, a smaller leakage inductance L and a smaller parasitic capacitance C are required.

In the LNA 20C using the transformer 25Y as a part of feedback network, theoretically, a differential output signal which has an amplitude twice as large as that of the single-phase input signal applied to the input terminal IN appears between the positive and negative differential output terminals NDO and PDO. This can cause the differential output signal to be fed back via the transformer 25Y in series to the single-phase input signal.

In the LNA 20C, as the phase compensation resistor 30 and the capacitor 31 are connected to the input-stage transistor 27, and the resistor 34 and the capacitor 35 are connected to the upper-stage transistor 32, sufficient phase compensation is achieved.

The feedback resistor 24 connected between the output terminal OUT and the input terminal IN allows shunt feedback of the single-phase amplified output signal to the single-phase input signal. In this circuit configuration, when the output impedance of the input signal source 22 is R, the optimal impedance matching can be achieved by setting the value of the feedback resistor 24 to 2 R. Normally, an LNA can be operated without an optimal input impedance matching, and a moderate value, typically −10 dB is given as the specification for the input-side reflection coefficient S11. In many cases, therefore, even with the resistance of the feedback resistor 24 being set to 2 R or higher, it is possible to achieve sufficient input impedance matching. The higher the resistance of the feedback resistor 24 is, the lower the noise figure becomes, so that it is desirable to set the resistance higher within the range where the specifications of the input impedance matching are satisfied.

In the LNA 20C, particularly, the input impedance matching state can be improved locally in a certain frequency band by utilizing an appropriate transformer 25Y, reducing the input impedance at a frequency region near $\omega_{z1}$ as explained in the foregoing description of the equation 2. This means that within a certain bandwidth around a frequency $\omega_{z1}$, the LNA 20C may have a lower S11 than that of the LNA 20A, which has a similar circuit form and a common value 2 R as the optimal resistance of the feedback resistor 24, when the resistance of the feedback resistor 24 is assumed to be the same in both of the amplifiers. In other words, it is possible to make the resistance of the feedback resistor 24 in the LNA 20C higher than that of the LNA 20A, when an identical specification for input impedance matching within a certain bandwidth around a frequency $\omega_{z1}$ is imposed to both of the amplifiers. Therefore, the LNA 20C may have a lower NF in comparison with the LNA 20A, when a specification for the input impedance matching is required to be satisfied only within a certain bandwidth around a frequency $\omega_{z1}$.

Further, while the LNA 20C obtains a differential output signal, the output impedances of the positive and negative differential output terminals PDO and NDO differ from each other. In addition, the output impedances of the differential output terminals PDO and NDO are higher than the output impedance of the negative differential output terminal of the LNA 20A in FIG. 6 which is equivalent to the output of the emitter follower. Therefore, the impedance of the load 42 must be sufficiently high so that a correct differential voltage signal may be output between the differential terminal PDO and NDO. As mentioned above regarding the equation 2, a higher impedance of the load 42 is desirable also for reducing the input impedance around a frequency $\omega_{z1}$.

While the LNA 20C theoretically operates as an amplifier with a voltage gain of 6 dB, the input impedance is not completely matched, so that the voltage gain measured in the simulation becomes about 8 dB.

Next, the performance of the LNA 20C of the embodiment is described based on simulation results.

Figure 14A:
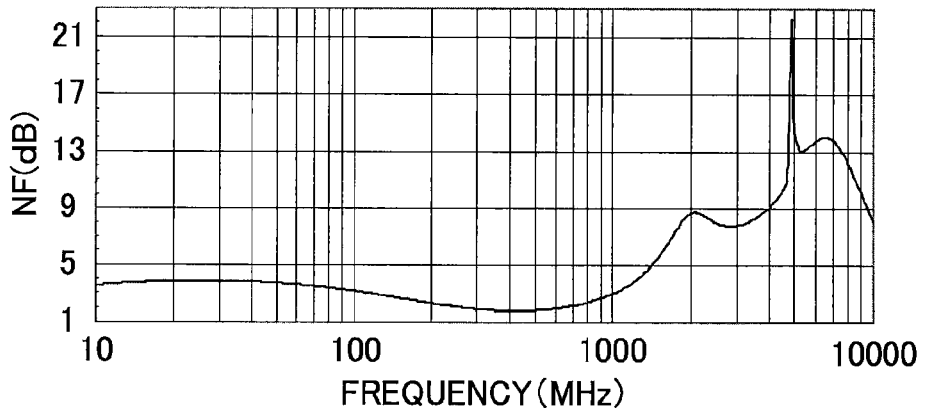
FIG. 14A is a diagram showing simulation results for a noise figure of the LNA in FIG. 12.
Figure 14B:
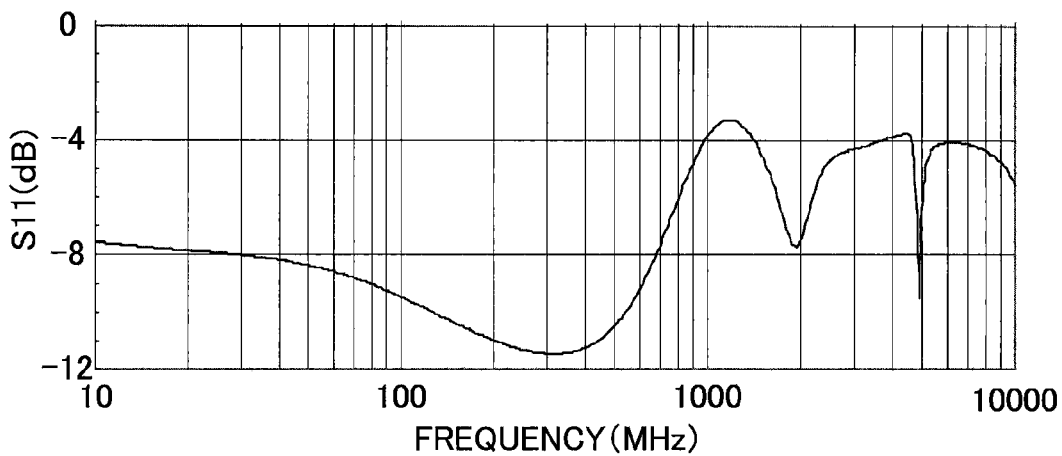
FIG. 14B is a diagram showing simulation results for an input-side reflection coefficient of the LNA in FIG. 12.
Figure 14C:
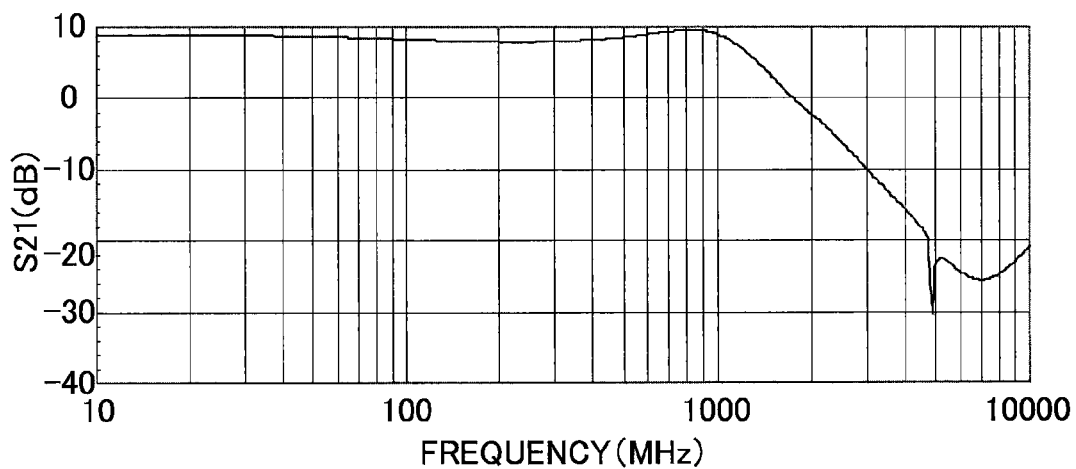
FIG. 14C is a diagram showing simulation results for a voltage gain of the LNA in FIG. 12.

FIGS. 14A to 14C are diagrams showing simulation results for the noise figure NF, the input-side reflection coefficient S11 and the voltage gain S21 of the LNA 20C in FIG. 12.

First, looking at the voltage gain S21, it is understood that the LNA 20C operates with a stable gain of 8.0 to 9.0 dB in a wide frequency band up to 600 MHz. The LNA 20C can increase the voltage gain to 9 dB or so by using the pair type transformer as compared with the LNA 20.

The value of the input-side reflection coefficient S11 falls down to −10 dB or below in a frequency band of 130 MHz to 540 MHz, achieving satisfactory input impedance matching. S11 is increased to −10 dB or greater in the frequency band of 130 MHz or lower, which shows that the use of the feedback resistor 24 having a high resistance value cannot ensure sufficient input impedance matching in the low frequency band. In other words, if the resistance of the feedback resistor 24 in the LNA 20C is reduced to the same value as that of the feedback resistor 24 used in the simulation of the LNA 20A, of which the result for S11 is shown in FIG. 7B, S11 of the LNA 20C will become lower than −10 dB in the frequency band below 130 MHz, while the NF will be deteriorated in accord with the trade-off between NF and S11. The use of the pair type transformer 25Y having the above-described adequate characteristic is the cause for reducing S11 to −10 dB or below in the frequency band of 130 MHz to 540 MHz even when the resistance of the feedback resistor 24 is not small enough to achieve sufficient input impedance matching in the low frequency band.

The frequency characteristic of the NF takes a minimum value of 1.8 dB near 420 MHz, and becomes 2.8 dB or lower in the range of 130 to 540 MHz. With this frequency characteristic of the NF compared with the frequency characteristic of the NF of the LNA 20 of the first embodiment, it is apparent that as in the LNA 20, a frequency region where the NF locally falls occurs in the high frequency band. This is originated from the use of the transformer 25Y having the adequate characteristic. This makes it possible to increase the upper limit of the frequency band where a good NF is maintained.

Figure 15:
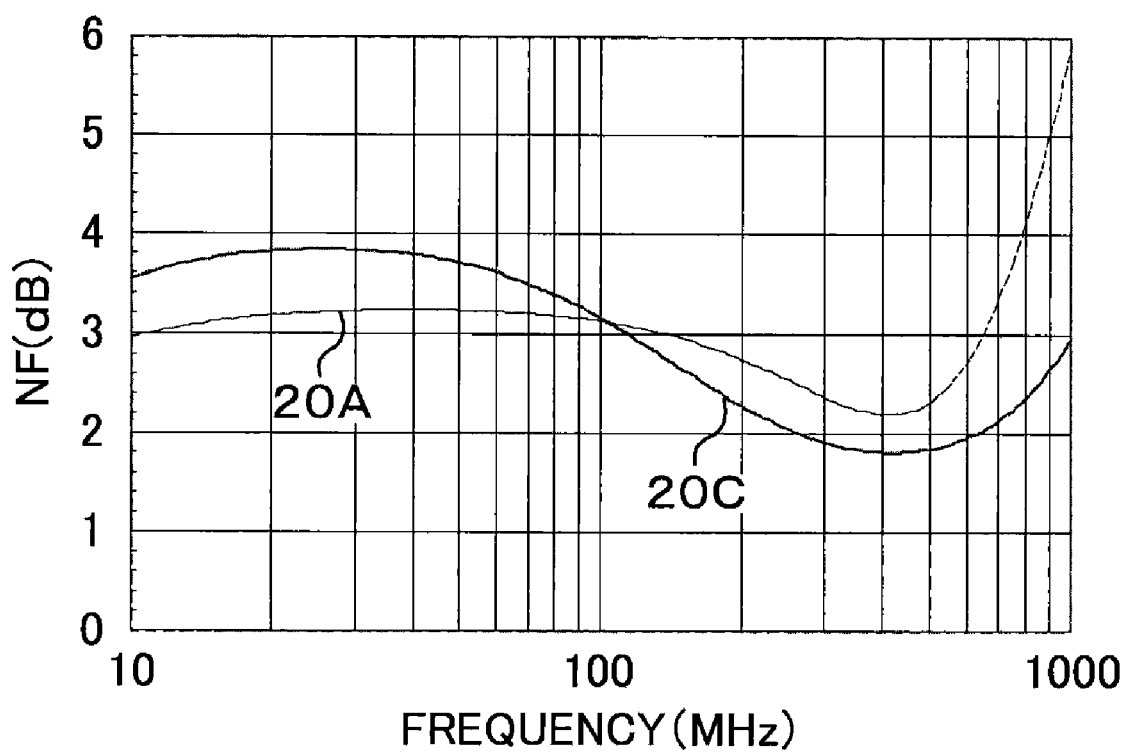
FIG. 15 is a diagram showing the noise figure of the LNA in FIG. 12 in comparison with the noise figure of the LNA in FIG. 6.

FIG. 15 shows the NF of the LNAs 20C and 20A in the range of 10 to 1000 MHz. Because the resistance value of the feedback resister 24 in the LNA 20C is higher than that of LNA 20A, the NF of the LNA 20C in the frequency hand above 100 MHz remains lower than that of the LNA 20A as shown in FIG. 15, while the S11 of the LNA 20C stays below −10 dB in the operating frequency range of 130 MHz to 540 MHz owing to the use of an appropriate transformer 25Y, as explained previously.

In the frequency band of 100 MHz or lower, the NF of the LNA 20C is higher than the NF of the LNA 20A. At the same time, the input-side reflection coefficient S11 is deteriorated in this band. That is, the LNA 20C has the characteristic specifically optimized for use in the operating frequency range of 130 MHz to 540 MHz.

Figure 16:
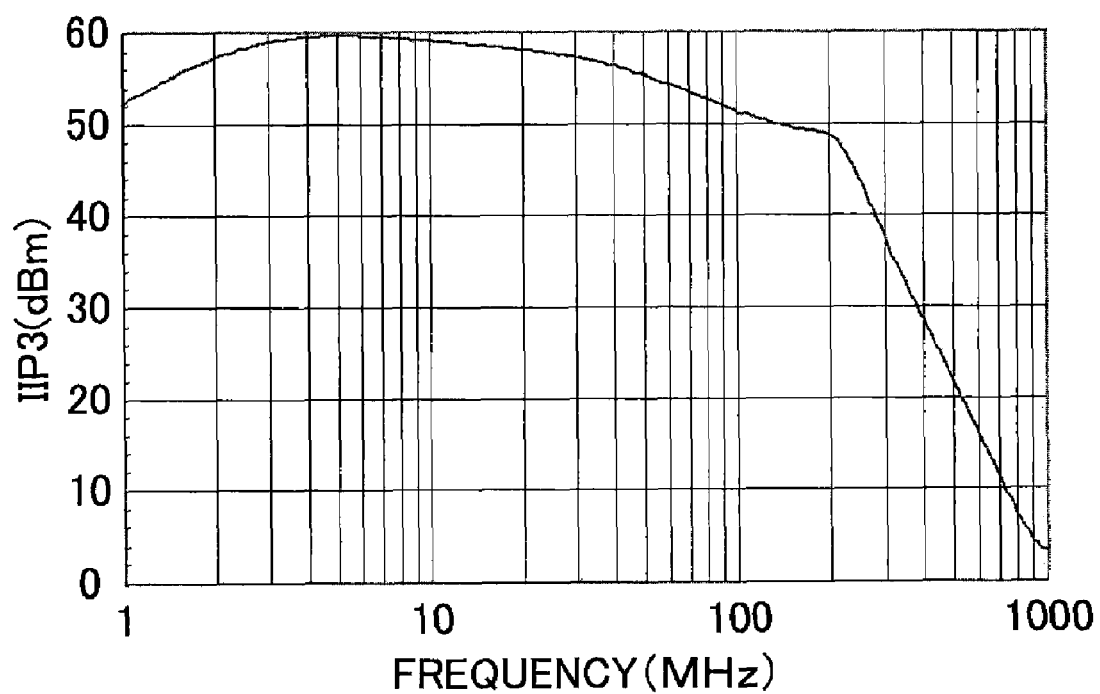
FIG. 16 is a diagram showing simulation results for the IIP3 characteristic of the LNA in FIG. 12.
Figure 17:
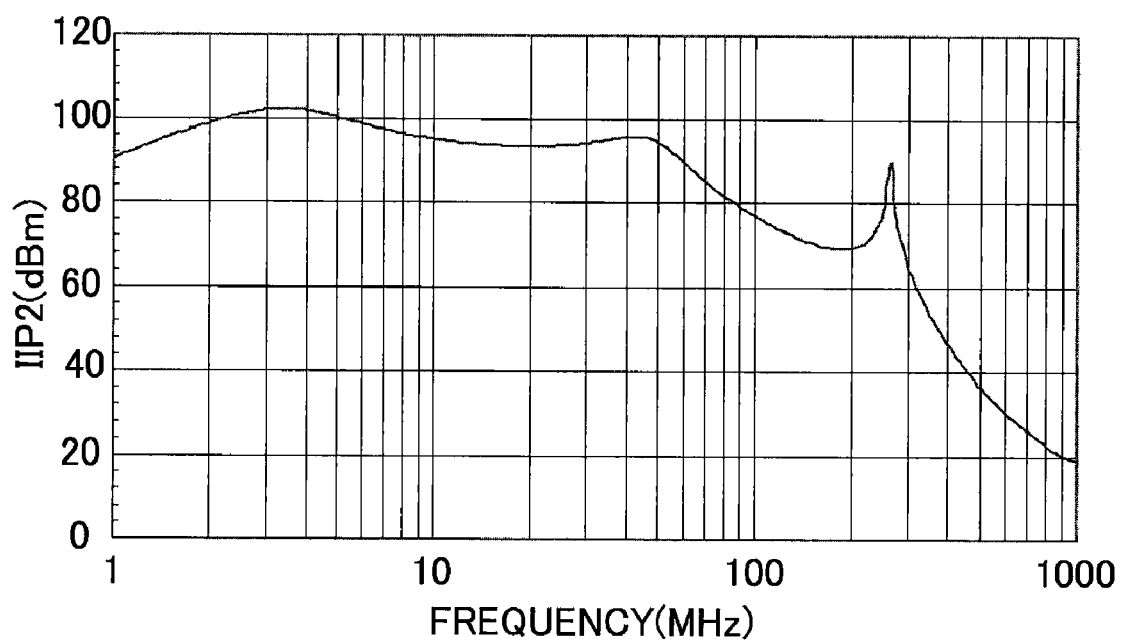
FIG. 17 is a diagram showing simulation results for the IIP2 characteristic of the LNA in FIG. 12.

FIGS. 16 and 17 are diagrams showing simulation results for the IIP3 characteristic and the IIP2 characteristic of the LNA 20C in FIG. 12; the simulation conditions are the same as those in the case of FIG. 4.

As shown in FIG. 16, IIP3 equal to or higher than +50 dBm is kept up to about 130 MHz, and IIP3 equal to or higher than +20 dBm is obtained below 500 MHz. In the LNA 20C, the resistance of the phase compensation resistor 34 and the capacitance of the capacitor 35 can be set small without relaxing phase and gain margin specifications for the feedback loop gain. This makes it possible to increase the cut off frequency of the feedback loop gain of the LNA 20C, sustaining the feedback loop gain high in a wide frequency range, without spoiling the stability of the amplifier. Therefore, a higher IIP3 value can be realized in a wide band by the use of the LNA 20C in comparison with conventional LNAs. In the frequency band (130 MHz to 540 MHz) where the LNA 20C satisfies the specifications of input impedance matching, the LNA 20C has an IIP3 value substantially equal to that of the LNA 20A.

As shown in FIG. 17, although a peak appears in the frequency characteristic of IIP2 at about 260 MHz, IIP2 of +70 dBm or higher is kept up to about 280 MHz, and IIP2 of +30 dBm or higher is obtained under 500 MHz, which shows that a good IIP2 characteristic is achieved in a wide band.

Figure 18:
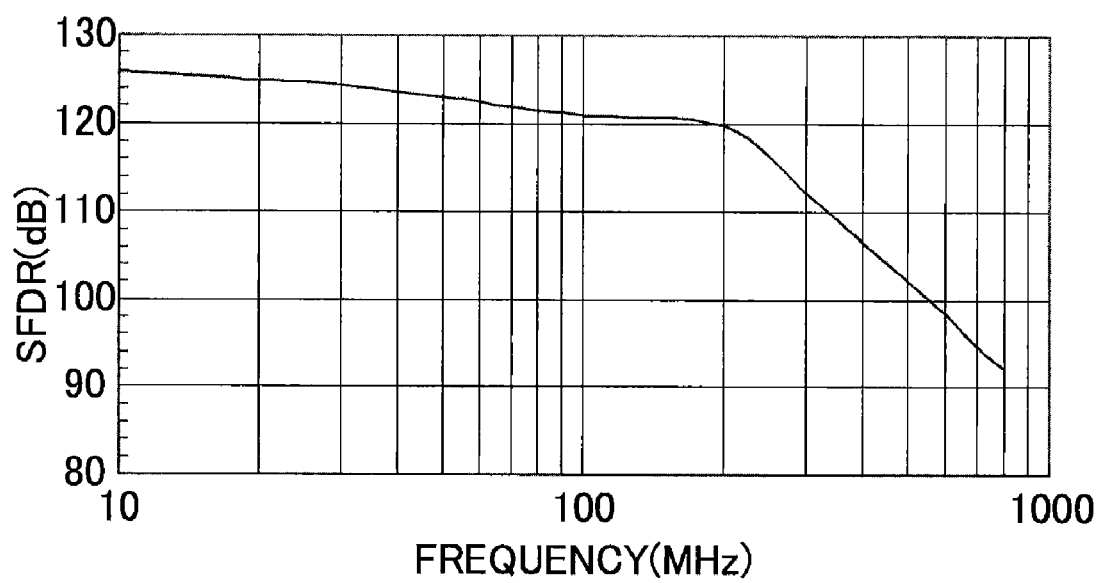
FIG. 18 is a diagram showing simulation results for the SFDR characteristic of the LNA in FIG. 12.

FIG. 18 is a diagram showing simulation results for the SFDR characteristic of the LNA 20C in FIG. 12; the computation conditions are the same as those of FIG. 10.

It is apparent from FIG. 18 that the SFDR value of almost 100 dB or higher is obtained in the operating frequency band of 130 MHz to 540 MHz.

As described above, the LNA 20C of the fourth embodiment can enhance input impedance matching within a certain high frequency range by using the pair type transformer 25Y having an adequate characteristic for the parasitic capacitance C and the leakage inductance L. The NF of the LNA 20C may be decreased by trading off the deterioration of input impedance matching for the reduction of noise power contribution from the feedback resistor 24. When the specification for the operating frequency range of the LNA 20C is contained within the high frequency range where the input impedance matching is enhanced, it is possible to satisfy a given specification for input impedance matching by offsetting the above mentioned deterioration of the input impedance matching with this enhancement. The LNA 20C has advantages such that, like the second embodiment, it can generate the differential signal by hardly increasing the circuit die area and the power consumption as compared with the single-phase amplifier having an equivalent performance, can function stably while maintaining a low noise figure and high IIP3 value, i.e., a high dynamic range in a certain frequency range, and can have a voltage gain of 6 dB or higher.

The voltage gain of the LNA 20C can be increased above 6 dB by setting the turn ratio of the transformer 25a to n:1 and the turn ratio of the transformer 25b to 1:n, where n is a real number larger than 1.

Fifth Embodiment

In the LNA 20C according to the fourth embodiment, the output impedances of the differential output terminals PDO and NDO are higher than the output impedance of an emitter follower. When the input impedance of a circuit to be connected to the output side is low, therefore, it is desirable to add the output buffers to the LNA 20C. Because the input terminal IN and the positive differential output terminal PDO are connected directly by the secondary winding of the transformer 25b, the reverse-directional voltage gain S12 of the LNA 20C does not become a very low value. When a low S12 value is demanded, therefore, it is also desirable to add the output buffers.

Figure 19:
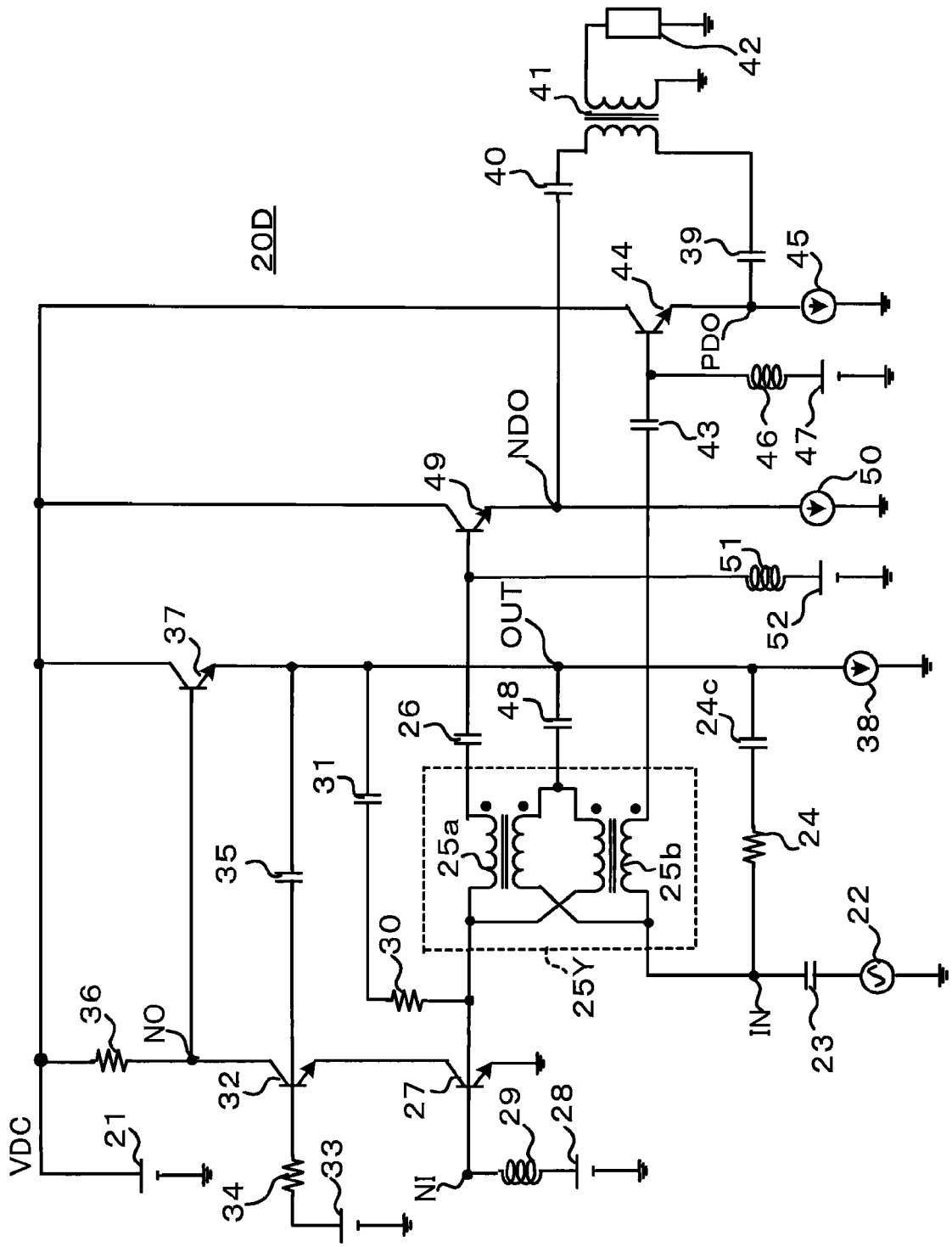
FIG. 19 is a circuit diagram showing a low noise amplifier according to a fifth embodiment of the invention.
Figure 20:
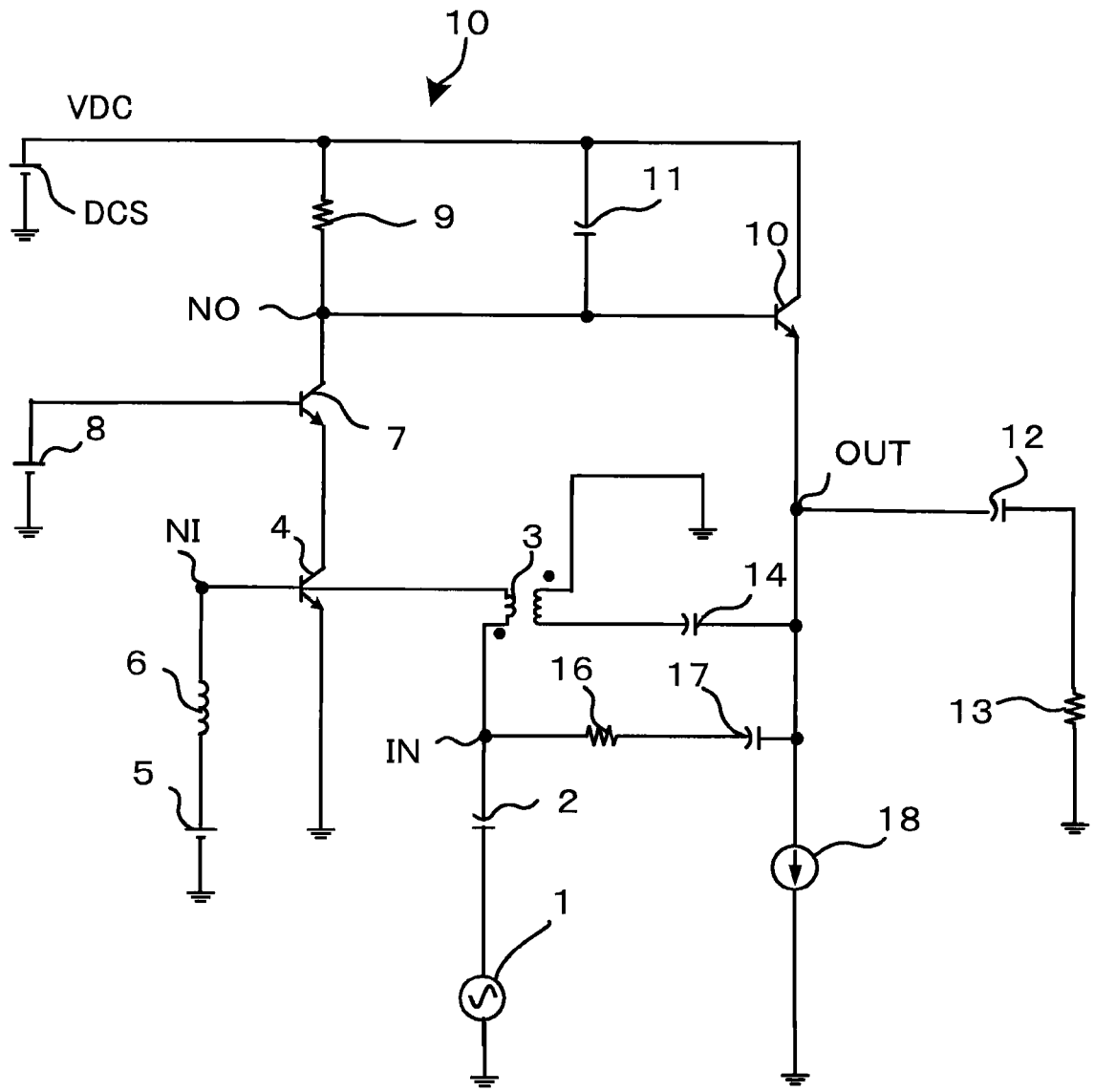
FIG. 20 is a circuit diagram showing one example of the conventional LNA.
Figure 21:
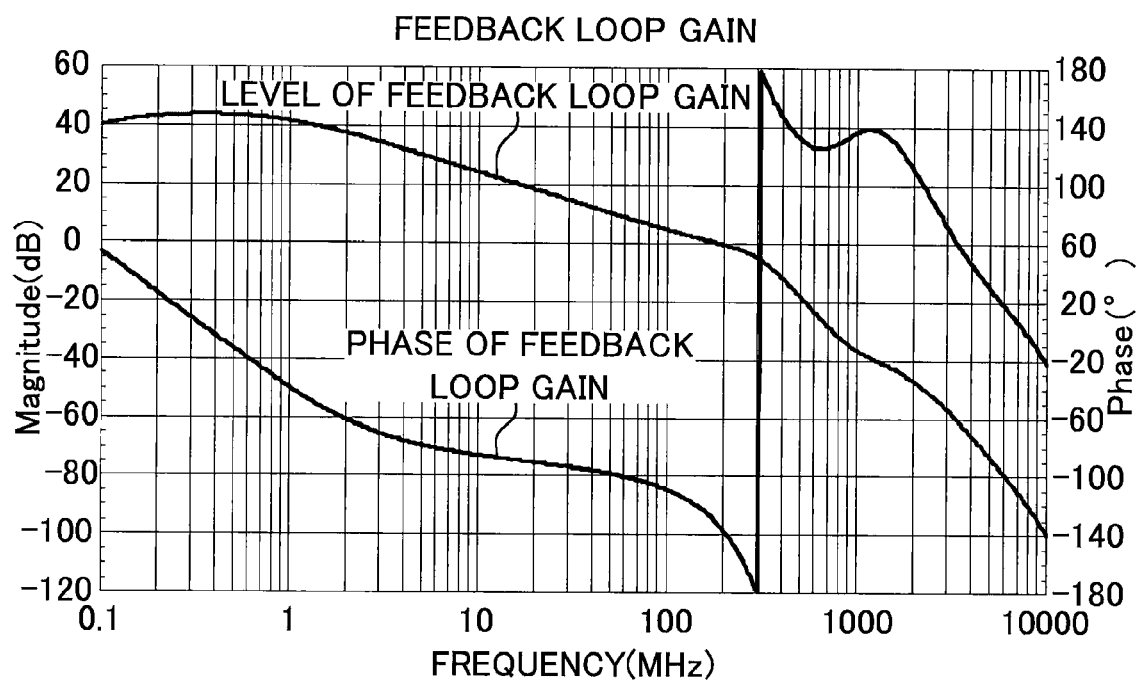
FIG. 21 is a diagram showing the Bode Plot of the feedback loop gain of the LNA in FIG. 20.
Figure 22:
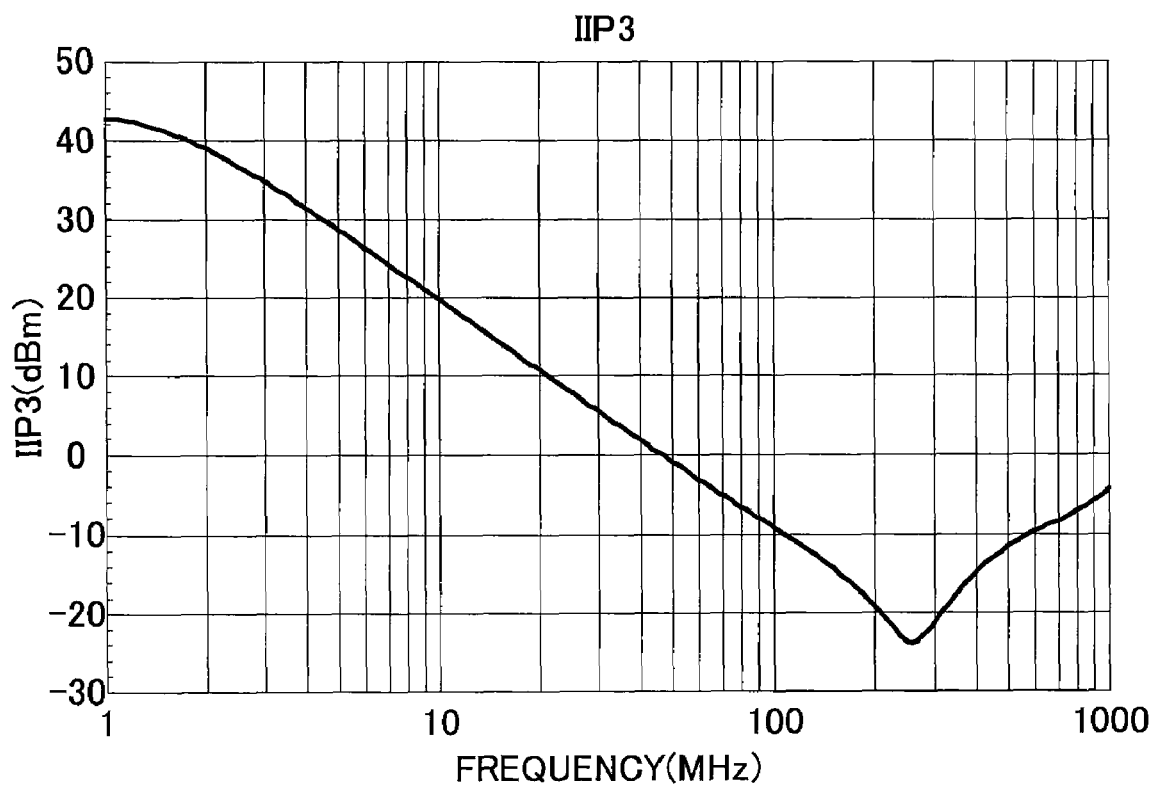
FIG. 22 is a diagram showing simulation results for the IIP3 characteristic of the LNA in FIG. 20.

As shown in FIG. 19, an LNA 20D according to a fifth embodiment of the invention has emitter-follower based output buffer circuits added between the transformer 25Y and the output transformer 41 of the LNA 20C in FIG. 12.

That is, the hot side of the secondary winding of the transformer 25b is connected via the coupling capacitor 43 to the base of the transistor 44. The transistor 44 has a collector supplied with the DC supply voltage VDC from the DC voltage source 21 and an emitter connected with the constant current source 45. The DC-biasing DC voltage source 47 is connected to the base of the transistor 44 via the choke coil 46. The constant current source 45 and the transistor 44 constitute an emitter follower, which operates as an output buffer circuit. This reduces the value of the output impedance of the positive differential output terminal PDO, which corresponds to the emitter of the transistor 44.

The hot side of the primary winding of the transformer 25a is connected via the capacitor 26 to the base of the transistor 49. The transistor 49 has a collector supplied with the DC supply voltage VDC from the DC voltage source 21 and an emitter connected with a constant current source 50. A DC-biasing DC voltage source 52 is connected to the base of the transistor 49 via a choke coil 51. The transistor 49 and the constant current source 50 constitute an emitter follower, which operates as an output buffer circuit. This reduces the value of the output impedance of the negative differential output terminal NDO, which corresponds to the emitter of the transistor 49.

As apparent from the above, the LNA 20D has two sets of emitter-follower based output buffer circuits connected to the output side of the transformer 25Y. This makes it possible to lower the output impedances of the positive differential output terminal PDO and the negative differential output terminal NDO and reduce the value of the reverse-directional voltage gain S12. However, the NF of the LNA 20D may be deteriorated due to noise generated from the transistors 44 and 49 of the added output buffer circuits, thus making it necessary to use a transistor with as lower noise as possible, in the emitter follower circuits.

The present invention is not limited to the first to fifth embodiments, but can be modified in various forms.

(1) An inductor can be added in series to the input terminal IN to improve input impedance matching in the high frequency band.

(2) While each transistor is a bipolar transistor, it may be an MOS transistor, or may comprise both a bipolar transistor and an MOS transistor.

(3) A coupling capacitor may be connected to the feedback resistor 24 in FIG. 1 in series as done in, for example, FIG. 6.

(4) While the primary winding of the output transformer 41 is connected to the positive differential output terminal PDO and the negative differential output terminal NDO via the coupling the capacitors 39 and 40, respectively, one of the capacitors may be eliminated.

(5) The "hot side" and "cold side" of the transformer are one example of expression, and represent the winding start end and the winding terminating end in a case where the directions of the windings of the coil are the same. Therefore, connection with the hot side and the cold side reversed provides the same results.

(6) The circuit configuration of the emitter follower which is an output buffer circuit is just an example, and another configuration, which reduces the output impedance may be available. For example, a resistor with an adequate value may be used instead of a constant current source.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. A low noise amplifier comprising:
   a cascode amplifier circuit that has input-stage and output-stage transistors connected in series to each other, and a load element, amplifies a signal at an input node connected with a control electrode of the input-stage transistor, and outputs the amplified signal from an output node of the output-stage transistor;
   an output circuit that amplifies a signal at the output node, and outputs the amplified signal to a first differential output terminal;
   a transformer having electro-magnetically coupled primary and secondary windings, the secondary winding having one end connected to an input terminal to which an input signal is applied, and another end connected to a second differential output terminal, the primary winding having one end connected to the input node and another end connected to the first differential output terminal;
   a feedback network that feeds back a signal at the first differential output terminal to the input terminal;
   a first phase compensation network connected between the control electrode of the input-stage transistor and the first differential output terminal; and
   a second phase compensation network connected between a control electrode of the output-stage transistor and the first differential output terminal.

2. The low noise amplifier according to claim 1, wherein a turn ratio of the primary winding to the secondary winding of the transformer is 1:1.

3. A low noise amplifier comprising:
   a cascode amplifier circuit that has input-stage and output-stage transistors connected in series to each other, and a load element, amplifies a signal at an input node connected with a control electrode of the input-stage transistor, and outputs the amplified signal from an output node of the output-stage transistor;
   an output circuit that amplifies a signal at the output node, and outputs the amplified signal to a first differential output terminal;
   a first transformer having electro-magnetically coupled primary and secondary windings, the secondary winding having one end connected to an input terminal to which an input signal is applied, the primary winding having one end connected to an input node and another end connected to the first differential output terminal;
   a second transformer having electro-magnetically coupled primary and secondary windings, the primary winding having one end connected to the input node and another end connected to the other end of the secondary winding of the first transformer, the secondary winding having one end connected to the input terminal and another end connected to a second differential output terminal;
   a feedback network that feeds back a signal at the first differential output terminal to the input terminal;
   a first phase compensation network connected between the control electrode of the input-stage transistor and the first differential output terminal; and
   a second phase compensation network connected between a control electrode of the output-stage transistor and the first differential output terminal.

4. The low noise amplifier according to claim 3, wherein the first and second transformers are pair type transformers which have a turn ratio of 1:1 and a same characteristic, and are integrated by using a multi-aperture core.

5. The low noise amplifier according to claim 3, wherein an output buffer circuit which reduces an output impedance is provided between the other end of the secondary winding of the second transformer and the second differential output terminal.

6. The low noise amplifier according to claim 5, wherein the first and second transformers are pair type transformers which have a turn ratio of 1:1 and a same characteristic, and are integrated by using a multi-aperture core.

7. A low noise amplifier comprising:
a cascode amplifier circuit that has input-stage and output-stage transistors connected in series to each other, and a load element, amplifies a signal at an input node connected with a control electrode of the input-stage transistor, and outputs the amplified signal from an output node of the output-stage transistor;
an output circuit that amplifies a signal at the output node, and outputs the amplified signal to an output terminal;
a first transformer having electro-magnetically coupled primary and secondary windings, the secondary winding having one end connected to an input terminal to which an input signal is applied, the primary winding having one end connected to the input node and another end connected to the first differential output terminal;
a second transformer having electro-magnetically coupled primary and secondary windings, the primary winding having one end connected to the input node and another end connected to the other end of the secondary winding of the first transformer, the secondary winding having one end connected to the input terminal and another end connected to a second differential output terminal;
a feedback network that feeds back a signal at the output terminal to the input terminal;
a first phase compensation network connected between the control electrode of the input-stage transistor and the output terminal; and
a second phase compensation network connected between a control electrode of the output-stage transistor and the output terminal,
wherein a node between the other end of the secondary winding of the first transformer and the other end of the primary winding of the second transformer is connected to the output terminal.

8. The low noise amplifier according to claim 7, wherein the first and second transformers are pair type transformers which have a turn ratio of 1:1 and a same characteristic, and are integrated by using a multi-aperture core.

9. The low noise amplifier according to claim 7, wherein a turn ratio of the primary winding to the secondary winding of the first transformer is n:1, a turn ratio of the primary winding to the secondary winding of the second transformer is 1:n where n is an arbitrary real number larger than 1, and the first transformer and the second transformer are integrated by using a multi-aperture core.

10. The low noise amplifier according to claim 7, wherein a first output buffer circuit which reduces an output impedance is provided between the other end of the primary winding of the first transformer and the first differential output terminal; and
a second output buffer circuit which reduces an output impedance is provided between the other end of the secondary winding of the second transformer and the second differential output terminal.

11. The low noise amplifier according to claim 10, wherein the first and second transformers are pair type transformers which have a turn ratio of 1:1 and a same characteristic, and are integrated by using a multi-aperture core.

12. The low noise amplifier according to claim 10, wherein a turn ratio of the primary winding to the secondary winding of the first transformer is n:1, a turn ratio of the primary winding to the secondary winding of the second transformer is 1:n where n is an arbitrary real number larger than 1, and the first transformer and the second transformer are integrated by using a multi-aperture core.

* * * * *